(12) United States Patent
Lee et al.

(10) Patent No.: US 11,437,561 B2
(45) Date of Patent: Sep. 6, 2022

(54) ACOUSTIC RESONATOR

(71) Applicant: SAMSUNG ELECTRO-MECHANICS CO., LTD., Suwon-si (KR)

(72) Inventors: Tae Kyung Lee, Suwon-si (KR); Jong Beom Kim, Suwon-si (KR); Min Jae Ahn, Suwon-si (KR); Jin Suk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 655 days.

(21) Appl. No.: 16/445,618

(22) Filed: Jun. 19, 2019

(65) Prior Publication Data

US 2020/0176666 A1 Jun. 4, 2020

(30) Foreign Application Priority Data

Nov. 29, 2018 (KR) .................. 10-2018-0150682
Mar. 14, 2019 (KR) .................. 10-2019-0029211

(51) Int. Cl.
| | |
|---|---|
| *H03H 9/17* | (2006.01) |
| *H01L 41/053* | (2006.01) |
| *H03H 9/56* | (2006.01) |
| *H03H 9/13* | (2006.01) |

(52) U.S. Cl.
CPC .......... *H01L 41/0533* (2013.01); *H03H 9/13* (2013.01); *H03H 9/171* (2013.01); *H03H 9/564* (2013.01)

(58) Field of Classification Search
CPC .......... H03H 9/171; H03H 9/13; H03H 9/564; H01L 41/0533
See application file for complete search history.

(56) References Cited

U.S. PATENT DOCUMENTS

| | | | | |
|---|---|---|---|---|
| 2001/0028285 | A1* | 10/2001 | Klee ...................... | H03H 9/566 333/191 |
| 2011/0073474 | A1 | 3/2011 | Cho et al. | |
| 2018/0351533 | A1* | 12/2018 | Lee ........................ | H03H 9/173 |

FOREIGN PATENT DOCUMENTS

| | | |
|---|---|---|
| CN | 104104357 A | 10/2014 |
| KR | 10-2011-0033521 A | 3/2011 |

* cited by examiner

*Primary Examiner* — J. San Martin
(74) *Attorney, Agent, or Firm* — NSIP Law

(57) ABSTRACT

An acoustic resonator comprises a substrate, a resonant portion disposed on the substrate and in which a first electrode, a piezoelectric layer, and a second electrode are stacked, a protective layer disposed on an upper portion of the resonant portion, and a hydrophobic layer formed on the protective layer, and the protective layer comprises a first protective layer stacked on the second electrode and a second protective layer stacked on the first protective layer, wherein a density of the second protective layer is higher than a density of the first protective layer.

18 Claims, 21 Drawing Sheets

| WIDTH OF SECOND ELECTRODE IN EXTENSION PORTION (μm) | ATTEN(dB) | $Kt^2$(%) | WIDTH OF SECOND ELECTRODE IN EXTENSION PORTION(μm) /INCLINED SURFACE LENGTH(μm) |
|---|---|---|---|
| −1.8 | 25.97 | 9.37 | — |
| −1.6 | 25.98 | 9.37 | — |
| −1.4 | 25.97 | 9.38 | — |
| −1.2 | 26.22 | 9.37 | — |
| −1 | 26.22 | 9.37 | — |
| −0.8 | 25.35 | 9.35 | — |
| −0.6 | 24.91 | 9.36 | — |
| −0.4 | 24.33 | 9.43 | — |
| −0.2 | 26.95 | 9.55 | — |
| 0 | 27.52 | 9.5 | 0 |
| 0.2 | 31.13 | 9.59 | 0.23 |
| 0.4 | 39.32 | 9.49 | 0.46 |
| 0.6 | 41.15 | 9.39 | 0.69 |
| 0.8 | 38.29 | 9.33 | 0.92 |
| 1 | 35.34 | 9.29 | 1.15 |
| 1.2 | 33.4 | 9.26 | 1.38 |
| 1.4 | 32.78 | 9.24 | 1.61 |
| 1.6 | 33.75 | 9.23 | 1.84 |
| 1.8 | 35.19 | 9.2 | 2.07 |
| 2 | 37.65 | 9.15 | 2.3 |
| 2.2 | 39.98 | 9.09 | 2.53 |
| 2.4 | 38.83 | 9.02 | 2.76 |
| 2.6 | 36.49 | 8.97 | 2.99 |
| 2.8 | 34.93 | 8.94 | 3.22 |
| 3 | 34.96 | 8.9 | 3.45 |
| 3.2 | 35.67 | 8.88 | 3.68 |
| 3.4 | 36.6 | 8.84 | 3.91 |
| 3.6 | 37.24 | 8.79 | 4.14 |
| 3.8 | 37.37 | 8.75 | 4.37 |
| 4 | 37.81 | 8.71 | 4.6 |
| 4.2 | 38.76 | 8.66 | 4.83 |
| 4.4 | 38.28 | 8.62 | 5.06 |
| 4.6 | 36.71 | 8.57 | 5.29 |
| 4.8 | 35.4 | 8.54 | 5.52 |
| 5 | 35.06 | 8.5 | 5.75 |
| 5.2 | 35.02 | 8.48 | 5.98 |
| 5.4 | 35.52 | 8.45 | 6.21 |
| 5.6 | 35.78 | 8.43 | 6.44 |
| 5.8 | 38.28 | 8.39 | 6.67 |
| 6 | 38.78 | 8.33 | 6.9 |
| 6.2 | 37.37 | 8.27 | 7.13 |
| 6.4 | 35.54 | 8.24 | 7.36 |
| 6.6 | 34.77 | 8.22 | 7.59 |
| 6.8 | 35.55 | 8.19 | 7.82 |
| 7 | 36.41 | 8.14 | 8.05 |

FIG. 13

ACOUSTIC RESONATOR

CROSS-REFERENCE TO RELATED APPLICATION(S)

This application claims the benefit under 35 USC § 119(a) of Korean Patent Application No. 10-2018-0150682 filed on Nov. 29, 2018, and Korean Patent Application No. 10-2019-0029211 filed on Mar. 14, 2019 in the Korean Intellectual Property Office, the entire disclosures of which are incorporated herein by reference for all purposes.

BACKGROUND

1. Field

The present disclosure relates to an acoustic resonator.

2. Description of Related Art

As technology related to mobile communications devices, chemical and bioelectronic devices, and similar device has rapidly developed, the desire for compact and lightweight filters, oscillators, resonant elements, and acoustic resonant mass sensors, implemented with such devices, has also increased.

A film bulk acoustic resonator (FBAR) may implement such compact and lightweight filters, oscillators, resonant elements, and acoustic resonance mass sensors.

The FBAR may be advantageous in that mass production may be possible at a minimal cost, and the FBAR may be implemented at a significantly smaller size. Moreover, a high quality factor (Q) value, a main characteristic of the filter, may be implemented, and the resonator may be used even in a microwave frequency band. In detail, the resonator may be implemented in personal communication system (PCS) bands and digital cordless system (DCS) bands.

Typically, the FBAR may be formed to have a structure that includes a resonant portion in which a first electrode, a piezoelectric body, and a second electrode are sequentially stacked on a substrate.

The principle of operation of the FBAR is as follows. First, when electrical energy is applied to first and second electrodes to induce an electric field in a piezoelectric layer, this electric field induces a piezoelectric phenomenon in the piezoelectric layer so that a resonant portion vibrates in a predetermined direction. As a result, a bulk acoustic wave is generated in a direction that is the same as a vibration direction, thereby causing resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an acoustic resonator includes a substrate, a resonant portion disposed on the substrate, and on which a first electrode, a piezoelectric layer, and a second electrode are stacked, a protective layer disposed on an upper portion of the resonant portion, a hydrophobic layer formed on the protective layer, wherein the protective layer comprises a first protective layer stacked on the second electrode, and a second protective layer stacked on the first protective layer, and wherein a density of the second protective layer is higher than a density of the first protective layer.

A cavity may be formed in a lower portion of the resonant portion, and the hydrophobic layer may be further formed on an inner wall of the cavity.

The second protective layer may be further disposed between the inner wall of the cavity and the hydrophobic layer.

The first protective layer may be formed of one of a silicon oxide-based insulating material and silicon nitride-based insulating material.

The second protective layer may be formed of one of an aluminum oxide-based insulating material, an aluminum nitride-based insulating material, a magnesium oxide-based insulating material, a titanium oxide-based insulating material, a zirconium oxide-based insulating material, and a zinc oxide series insulating material.

The first protective layer may be formed of one of silicon dioxide ($SiO_2$), silicon nitride ($Si_3N_4$), amorphous silicon (a-Si), and polycrystalline silicon (p-Si).

The second protective layer may be formed of one of aluminum oxide ($Al_2O_3$) aluminum nitride (AlN), magnesium oxide (MgO), titanium oxide ($TiO_2$), zirconium oxide ($ZrO_2$), zinc oxide (ZnO).

The second protective layer may be formed to have a thickness that is less than a thickness of the first protective layer.

The hydrophobic layer may be formed of a self-assembled monolayer (SAM) forming material.

The hydrophobic layer may be a thickness of 100 Å or less.

The hydrophobic layer may contain a fluorine (F) component.

The hydrophobic layer may contain fluorocarbon that has a silicon head.

The resonant portion may include a center portion; an extension portion that extends outwardly from the center portion; and an insertion layer that is disposed in a lower portion of the piezoelectric layer, and the piezoelectric layer comprises a piezoelectric portion disposed in the center portion, and a bent portion disposed in the extension portion, and configured to extend from the piezoelectric portion to be inclined along a shape of the insertion layer.

A membrane layer may be disposed on the substrate, and may be configured to support the resonant portion, and a cavity disposed between the membrane layer and the substrate, wherein the membrane layer includes a first membrane layer and a second membrane layer disposed between the first membrane layer and the first electrode, and the first membrane layer is formed of a material having a density that is higher than a density of the second membrane layer.

The second membrane layer may be formed of one of a silicon oxide-based insulating material and a silicon nitride-based insulating material.

The second membrane layer may be formed of one of an aluminum oxide-based insulating material, an aluminum nitride-based insulating material, a magnesium oxide-based insulating material, a titanium oxide-based insulating material, a zirconium oxide-based insulating material, and a zinc oxide-based insulating material.

In a general aspect, an acoustic resonator includes a substrate, a resonant portion disposed on the substrate, and on which a first electrode, a piezoelectric layer, and a second electrode are stacked, a protective layer disposed on an upper portion of the resonant portion, a cavity disposed between the first electrode and the substrate, a first hydrophobic layer formed on the protective layer; and a second hydrophobic layer formed on at least one inner wall of the cavity.

The first hydrophobic layer and the second hydrophobic layer may be formed of a self-assembled monolayer (SAM) forming material.

Other features and aspects will be apparent from the following detailed description, the drawings, and the claims.

BRIEF DESCRIPTION OF DRAWINGS

FIG. 13 is a table summarizing an example of a value of the graph illustrated in FIG. 12;

Figure 1:
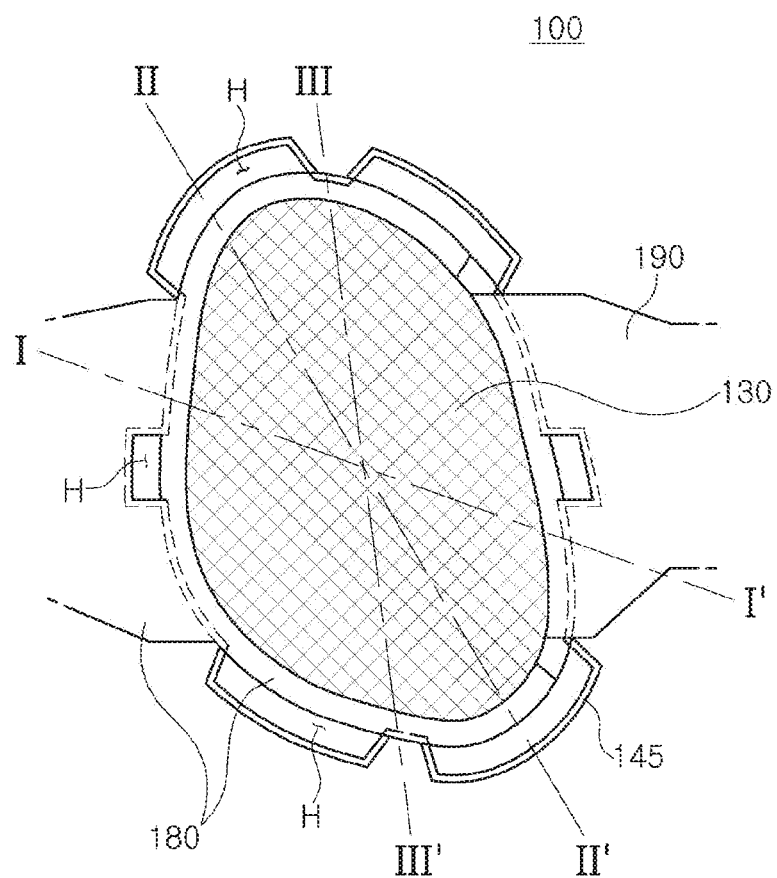
FIG. 1 is an example of a plan view of an acoustic resonator in accordance with one or more embodiments.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," and "lower" and the like, may be used herein for ease of description to describe one element's relationship to another element or elements as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, examples will be described with reference to schematic views illustrating embodiments of the present disclosure. In the drawings, for example, due to manufacturing techniques and/or tolerances, modifications of the shape shown may be estimated. Thus, examples should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Acoustic Resonator

Figure 2:
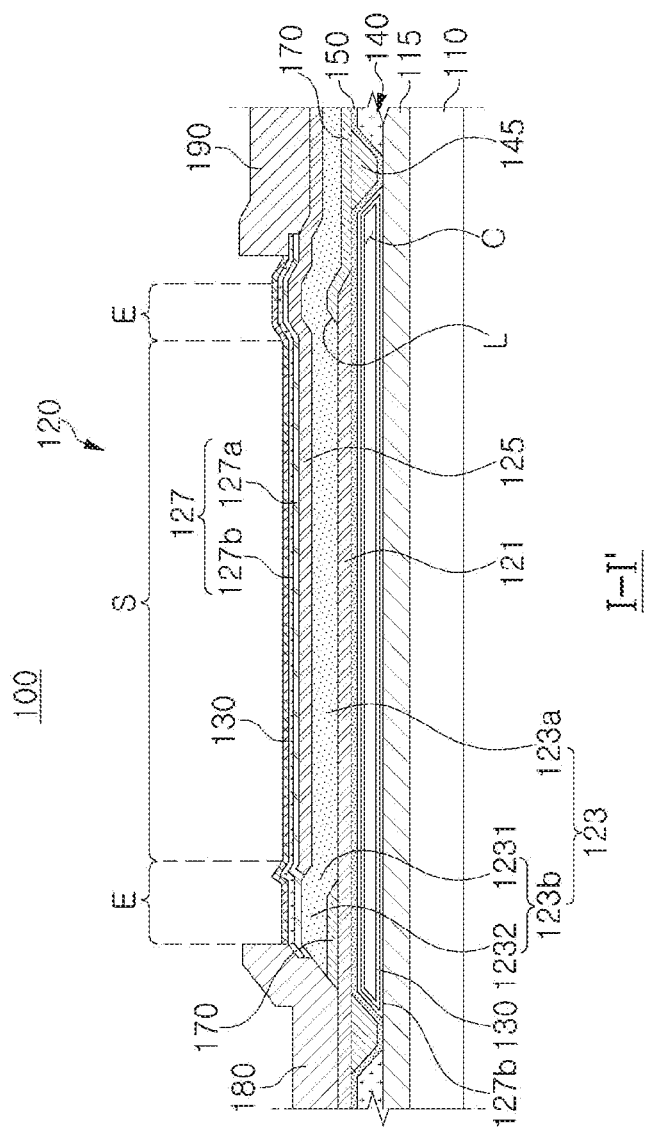
FIG. 2 is an example of a cross-sectional view taken along line I-I' of FIG. 1.
Figure 3:
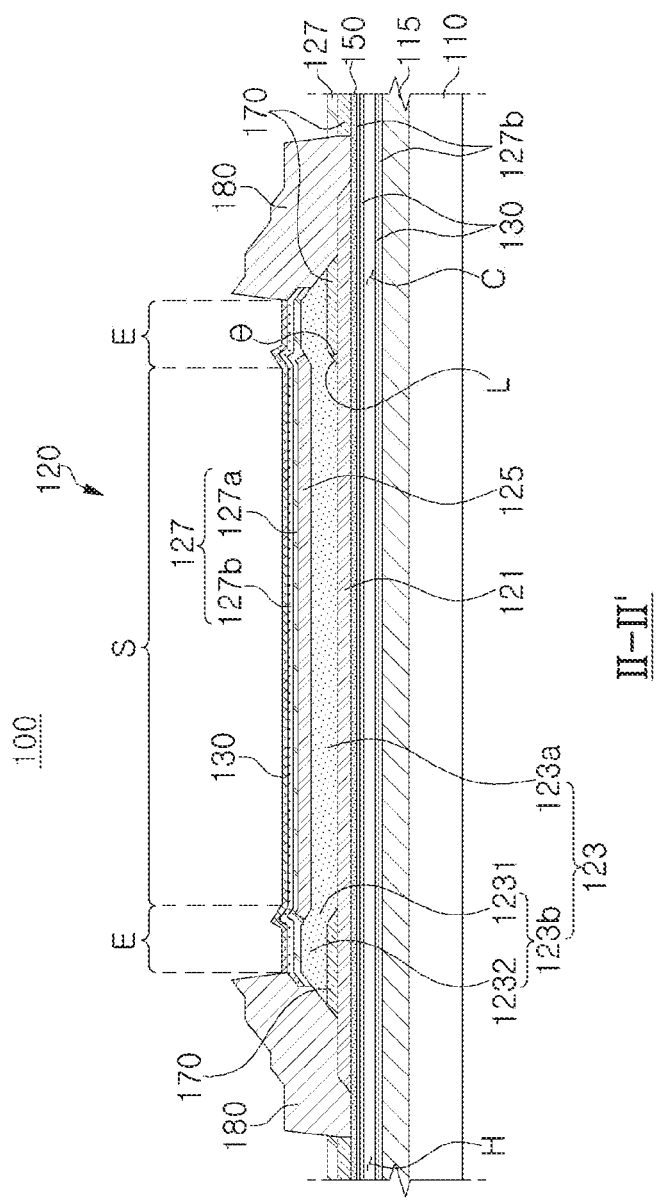
FIG. 3 is an example of a cross-sectional view taken along line II-II' of FIG. 1.
Figure 4:
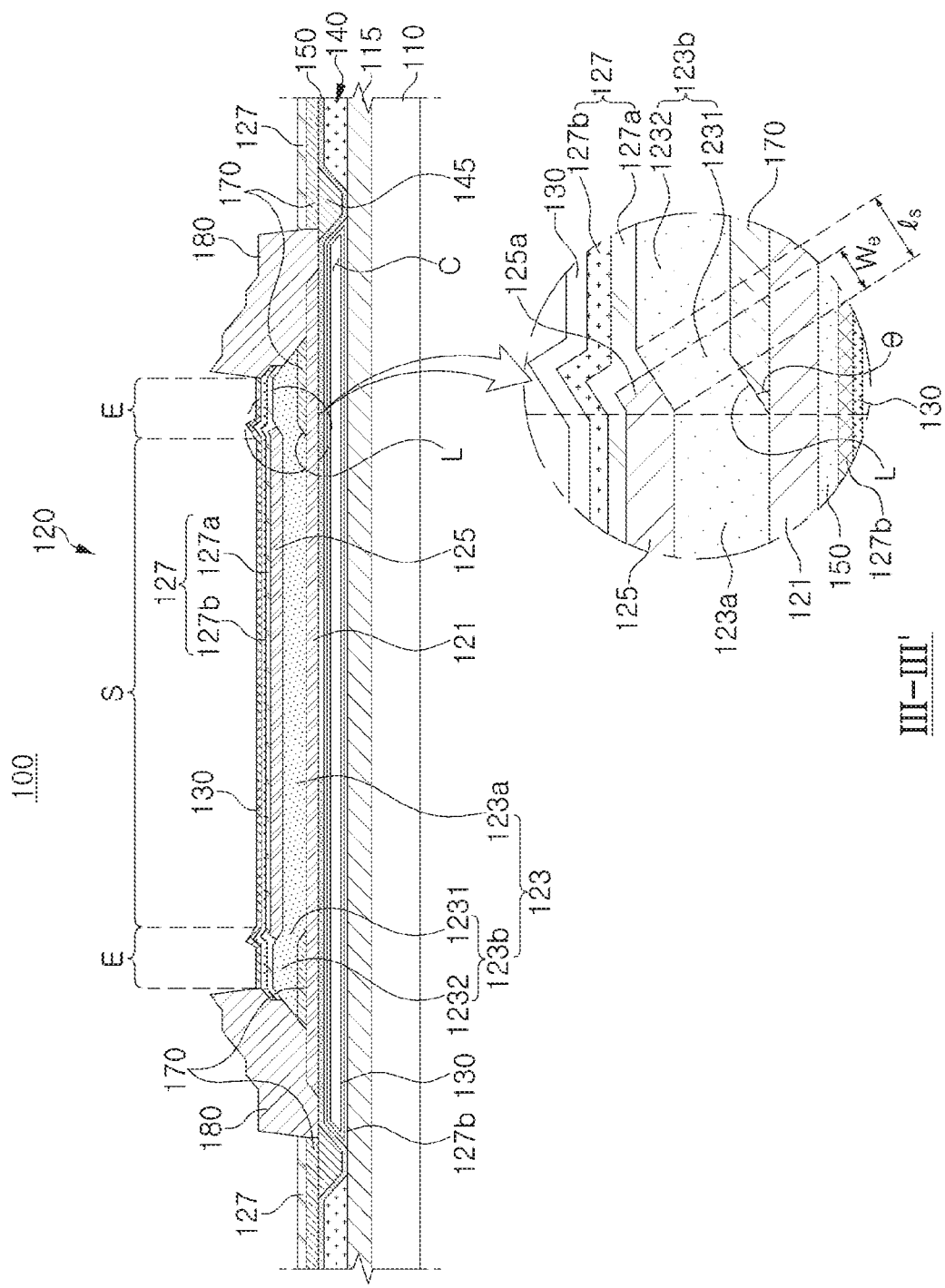
FIG. 4 is an example of a cross-sectional view taken along line III-III' of FIG. 1.

FIG. 1 is a plan view illustrating an example of an acoustic resonator according to one or more embodiments, and FIG. 2 is a cross-sectional view taken along line I-I' of FIG. 1. Moreover, FIG. 3 is a cross-sectional view taken along line II-II' of FIG. 1, and FIG. 4 is a cross-sectional view taken along line III-III' of FIG. 1.

Referring to FIGS. 1 to 4, an acoustic resonator 100 according to an example may be a film bulk acoustic resonator (FBAR), and may include a substrate 110, an insulating layer 115, a membrane layer 150, a cavity C, a resonant portion 120, a protective layer 127, and a hydrophobic layer 130.

The substrate 110 may be a silicon substrate. For example, a silicon wafer or a silicon-on-insulator (SOI) substrate may be used as the substrate 110. However, the substrate is not limited thereto, and other materials may be used as the substrate.

An insulating layer 115 may be provided on an upper surface of the substrate 110 to electrically isolate the substrate 110 and the resonant portion 120 from each other. Moreover, the insulating layer 115 may prevent the substrate 110 from being etched by an etching gas, when a cavity C is formed during a method of manufacturing an acoustic resonator.

In this example, the insulating layer 115 may be formed of at least one among silicon dioxide ($SiO_2$), silicon nitride ($Si_3N_4$), aluminum oxide ($Al_2O_3$), and aluminum nitride (AlN), and may be formed on the substrate 110 through one of processes such as chemical vapor deposition, RF magnetron sputtering, and evaporation.

The sacrificial layer 140 may be formed on the insulating layer 115, and the cavity C and the etch-stop portion 145 may be disposed in the sacrificial layer 140.

The cavity C is formed as an empty space, and may be formed by removing a portion of the sacrificial layer 140.

As the cavity C may be formed in the sacrificial layer 140, the entirety of the resonant portion 120, that is formed above the sacrificial layer 140, may be formed in a flat state. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The etch-stop portion 145 is disposed along a boundary of the cavity C. The etch-stop portion 145 may prevent etching from proceeding into a cavity region during formation of the cavity C. Thus, a horizontal area of the cavity C is defined by the etch-stop portion 145, and the vertical area is defined by a thickness of the sacrificial layer 140.

The membrane layer 150 may be formed on the sacrificial layer 140, and may define a thickness (or a height) of the cavity C with the substrate 110. Thus, the membrane layer 150 may also be formed of a material, which may not be easily removed during a process for forming the cavity C.

For example, when a halide-based etching gas such as fluorine (F), chlorine (Cl), or a similar material, is used in order to remove a portion of the sacrificial layer 140 (for example, a cavity region), the membrane layer 150 may be formed of a material having a low reactivity with the etching gas described above. In this example, the membrane layer 150 may include at least one of silicon dioxide ($SiO_2$) and silicon nitride ($Si_3N_4$).

Moreover, the membrane layer 150 may include a dielectric layer including at least one of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or may include a metal layer including at least one among aluminum (Al), nickel (Ni), chrome (Cr), platinum (Pt), gallium (Ga), hafnium (Hf), and titanium (Ti). The configuration of an embodiment is not, however, limited thereto.

A seed layer (not shown) may be formed on the membrane layer 150. In detail, in a non-limiting example, the seed layer may be disposed between the membrane layer 150 and the first electrode 121. The seed layer may be formed of an aluminum nitride (AlN) material, but is not limited thereto. Alternatively, the seed layer may be formed using a dielectric or metal having a hexagonal close packed (HCP) structure. When the seed layer is formed using the metal, the seed layer may be formed of titanium (Ti) and ruthenium (Ru), but is not limited thereto.

The resonant portion 120 may include a first electrode 121, a piezoelectric layer 123, and a second electrode 125. In the resonant portion 120, the first electrode 121, the piezoelectric layer 123, and the second electrode 125 may be stacked from bottom to top. Thus, in the resonant portion 120, the piezoelectric layer 123 may be disposed between the first electrode 121 and the second electrode 125.

The resonant portion 120 may be formed on the membrane layer 150, and accordingly, the membrane layer 150, the first electrode 121, the piezoelectric layer 123, and the second electrode 125 may be sequentially stacked to form the resonant portion 120.

The resonant portion 120 may resonate the piezoelectric layer 123 according to a signal, applied to the first electrode 121 and the second electrode 125, to generate a resonance frequency and an antiresonance frequency.

When the insertion layer 170, to be described later, is formed, the resonant portion 120 may be divided into a center portion S, in which the first electrode 121, the piezoelectric layer 123, and the second electrode 125 are stacked in a substantially flat manner, in a bottom to top formation, and an extension portion E with the insertion layer 170 interposed between the first electrode 121 and the piezoelectric layer 123.

The center portion S is a region disposed in the center of the resonant portion 120, and the extension portion E is a region disposed along a periphery of the center portion S. Accordingly, the extension portion E refers to a region that extends outwardly from the center portion S. Thus, as illustrated in FIGS. 2 to 4, in a cross section in which the resonant portion 120 is cut to cross the center portion S, the extension portion E is disposed on each of both ends of the center portion S.

The insertion layer 170 has an inclined surface L of which a thickness becomes greater as a distance from the center portion S increases.

In the extension portion E, the piezoelectric layer 123 and the second electrode 125 are disposed in an upper portion of the insertion layer 170. Thus, the piezoelectric layer 123 and the second electrode 125, located in the extension portion E, have an inclined surface along a shape of the insertion layer 170.

Meanwhile, in the present example, the extension portion E may be included in the resonant portion 120, and thus resonance may occur even in the extension portion E. However, the example is not limited thereto, and resonance may not occur in the extension portion E, but may occur in the center portion S, depending on a structure of the extension portion E.

The first electrode 121 and the second electrode 125 may be formed of a conductor, for example, gold, copper, molybdenum, ruthenium, iridium, aluminum, platinum, titanium, tungsten, palladium, tantalum, chromium, nickel, an aluminum alloy, or a metal containing at least one among them, but are not limited thereto.

The first electrode 121 may have an area that is wider than an area of the second electrode 125 in the resonant portion 120, and a first metal layer 180 may be disposed on at least a portion of the first electrode 121 along an outer edge of the first electrode 121. Thus, in an example, the first metal layer 180 may be disposed to surround the second electrode 125.

Since the first electrode 121 is disposed on the membrane layer 150, the first electrode may be entirely flat. On the other hand, since the second electrode 125 is disposed on the piezoelectric layer 123, the second electrode may have a bent portion corresponding to a shape of the piezoelectric layer 123.

The first electrode 121 may be used as one of an input electrode and an output electrode, inputting and outputting an electrical signal such as a radio frequency (RF) signal, or the like.

A first portion of the second electrode 125 may be disposed in the entire area of the center portion S, and a second portion of the second electrode 125 may be partially disposed in the extension portion E. Thus, the second electrode 125 may be divided into a portion disposed on the piezoelectric portion 123a of the piezoelectric layer 123, to be described later, and a portion disposed on the bent portion 123b of the piezoelectric layer 123 within the extension portion E.

In further detail, in an example, the second electrode 125 may be disposed to cover the entire piezoelectric portion 123a, and a portion of an inclined portion 1231 of the piezoelectric layer 123. Thus, the second electrode 125a, disposed in the extension portion E, may be formed to have an area smaller than an area of an inclined surface of the inclined portion 1231, and the second electrode 125, disposed in the resonant portion 120, may be formed to have an area smaller than an area of the piezoelectric layer 123.

Accordingly, as illustrated in FIG. 3, in a cross section in which the resonant portion 120 is cut to cross the center portion S, an end of the second electrode 125 may be disposed in the extension portion E. Moreover, at least a portion of the end of the second electrode 125, disposed in the extension portion E, may be disposed to overlap the insertion layer 170. Here, 'overlap' indicates that a shape of the second electrode 125, projected on a plane, overlaps the insertion layer 170, when the second electrode 125 is projected on the plane on which the insertion layer 170 is disposed.

The second electrode 125 may be used as one of an input electrode and an output electrode, and may input and output an electrical signal such as an RF signal, or the like. In other words, when the first electrode 121 is used as an input electrode, the second electrode 125 may be used as an output electrode. Alternatively, when the first electrode 121 is used as an output electrode, the second electrode 125 may be used as an input electrode.

The piezoelectric layer 123 may be formed on the first electrode 121. When the insertion layer 170, to be described later, is formed, the insertion layer may be formed on the first electrode 121 and the insertion layer 170.

Zinc oxide (ZnO), aluminum nitride (AlN), doped aluminum nitride, lead zirconate titanate, and quartz may be selectively used as a material of the piezoelectric layer 123. In the case of the doped aluminum nitride, a rare earth metal, a transition metal, or an alkaline earth metal may be further included. For example, the rare earth metal may include at least one among scandium (Sc), erbium (Er), yttrium (Y), and lanthanum (La). The transition metal may include at least one among hafnium (Hf), titanium (Ti), zirconium (Zr), tantalum (Ta), and niobium (Nb). Moreover, the alkaline earth metal may include magnesium (Mg).

The piezoelectric layer 123 according to an example includes a piezoelectric portion 123a disposed in the center portion S, and a bent portion 123b disposed in the extension portion E.

The piezoelectric portion 123a is a portion stacked directly on an upper surface of the first electrode 121. Thus, the piezoelectric portion 123a is interposed between the first electrode 121 and the second electrode 125, and may be formed to be in a flat form with the first electrode 121 and the second electrode 125.

The bent portion 123b may be defined as a region that extends outwardly from the piezoelectric portion 123a, and located within the extension portion E.

The bent portion 123b may be disposed on the insertion layer 170, to be described later, and may be formed to have a shape which rises along a shape of the insertion layer 170. Thus, the piezoelectric layer 123 is bent at a boundary between the piezoelectric portion 123a and the bent portion 123b, and the bent portion 123b rises to correspond to a thickness and a shape, of the insertion layer 170.

The bent portion 123b may be divided into an inclined portion 1231 and an extended portion 1232.

The inclined portion 1231 refers to a portion that is formed to be inclined along an inclined surface L of the insertion layer 170, to be described later. Moreover, the extended portion 1232 refers to a portion that extends outwardly from the inclined portion 1231.

The inclined portion 1231 is formed parallel to the inclined surface L of the insertion layer 170, and an inclination angle of the inclined portion 1231 may be equal to an inclination angle (θ of FIG. 4) of the inclined surface L of the insertion layer 170.

The insertion layer 170 may be disposed along a surface formed by the membrane layer 150 and the first electrode 121, and the etch-stop portion 145.

The insertion layer 170 is disposed around the center portion S and supports the bent portion 123b of the piezoelectric layer 123. Thus, the bent portion 123b of the piezoelectric layer 123 may be divided into an inclined portion 1231 and an extended portion 1232, along a shape of the insertion layer 170.

The insertion layer 170 is disposed in a region except for the center portion S. For example, the insertion layer 170 may be disposed in the entirety of a region excluding the center portion S, or in some regions of the region excluding the center portion S.

Moreover, at least a portion of the insertion layer 170 may be disposed between the piezoelectric layer 123 and the first electrode 121.

A side surface of the insertion layer 170, disposed along a boundary of the center portion S, may be formed to have a shape which becomes thicker as a distance away from the center portion S increases. Thus, as illustrated in FIG. 4, the insertion layer 170 has a side surface, disposed to be adjacent to the center portion S, as an inclined surface L having a constant inclination angle θ.

If the inclination angle θ of the side surface of the insertion layer 170 is formed to be less than 5°, during a manufacturing process, a thickness of the insertion layer 170 may be significantly small, or an area of the inclined surface L may be significantly large. Hence, there is difficulty in its substantial implementation.

Moreover, if the inclination angle θ of the side surface of the insertion layer 170 is greater than 70°, the inclination angle of the inclined portion 1231 of the piezoelectric layer 123, stacked on the insertion layer 170, is also greater than 70°. In this example, the piezoelectric layer 123 is excessively bent, so cracking may occur in a bent portion of the piezoelectric layer 123.

Thus, in an example, the inclination angle θ of the inclined surface L is formed in a range of 5° or more and 70° or less.

The insertion layer 170 may be formed of a dielectric material such as silicon oxide ($SiO_2$), aluminum nitride (AlN), aluminum oxide ($Al_2O_3$), silicon nitride ($Si_3N_4$), magnesium oxide (MgO), zirconium oxide ($ZrO_2$), lead zirconate titanate (PZT), gallium arsenide (GaAs), oxide hafnium ($HfO_2$), titanium oxide ($TiO_2$), zinc oxide (ZnO), and the like, and may be formed of a material different from that of the piezoelectric layer 123. Also, if necessary, the insertion layer 170 may be formed of a metal material. In this example, the insertion layer 170 may be formed of aluminum or an aluminum alloy.

In an embodiment, a thickness of the insertion layer 170 may be less than a thickness of the piezoelectric layer 123. If the insertion layer 170 is thicker than the piezoelectric layer 123, it may be difficult to form the bent portion 123b, in which bending is formed along a shape of the insertion layer 170. Moreover, when the insertion layer 170 has a thickness of 100 Å or more, the bent portion 123b may be easily formed, and sound waves in a horizontal direction of an acoustic resonator may be effectively blocked. Thus, a resonator performance may be improved.

The resonant portion 120 according to an example configured as described above may be spaced apart from the substrate 110 through the cavity C, provided as an empty space.

The cavity C may be formed by removing a portion of the sacrificial layer 140 by supplying an etching gas (or an etching solution) to an inlet hole (H of FIGS. 1 and 3) during a process for manufacturing an acoustic resonator. Here, the cavity C is formed as a space in which an upper surface (top surface) and a side surface (wall surface) are formed by the membrane layer 150, and a bottom surface is formed by the substrate 110 or the insulating layer 115. On the other hand, the membrane layer 150 may only be formed on the upper surface (top surface) according to an order of a manufacturing method.

The protective layer 127 may be disposed along a surface of the acoustic resonator 100 to protect the acoustic resonator 100 from external elements. The protective layer 127 may be disposed along a surface formed by the second electrode 125, the bent portion 123b of the piezoelectric layer 123, and the insertion layer 170. The protective layer 127 may include a first protective layer 127a, formed of a silicon oxide-based or silicon nitride-based insulating material, and a second protective layer 127b, formed of one among aluminum oxide-based, aluminum nitride-based, magnesium oxide-based, titanium oxide-based, zirconium oxide-based, and zinc oxide-based insulating materials.

The second protective layer 127b may be stacked on an upper portion of the first protective layer 127a. The protective layer 127 according to an embodiment will be described later in more detail.

The first electrode 121 and the second electrode 125 may be extended to an external portion of the resonant portion 120, and a first metal layer 180 and a second metal layer 190 may be disposed in upper surfaces of the extended portions, respectively.

The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum (Al) alloy, or the like, but are not limited thereto.

The first metal layer 180 and the second metal layer 190 may serve as a connection wiring, electrically connecting the electrodes 121 and 125 of the acoustic resonator according to an example, to an electrode of another acoustic resonator disposed adjacent thereto, or as an external connection terminal. The present disclosure is not, however, limited thereto.

The first metal layer 180 may pass through the insertion layer 170 and the protective layer 127 to be bonded to the first electrode 121.

Moreover, as illustrated in FIG. 3, the first electrode 121 may have an area wider than an area of the second electrode 125 in the resonant portion 120, and a first metal layer 180 may be formed in a peripheral portion of the first electrode 121.

Thus, the first metal layer 180 may be disposed along a periphery of the resonant portion 120, and may be disposed to surround the second electrode 125. The present disclosure is not, however, limited thereto.

On the other hand, as described above, the second electrode 125 according to an example may be stacked on the piezoelectric portion 123a and the inclined portion 1231, of the piezoelectric layer 123. Moreover, a portion (125a of FIG. 4) of the second electrode 125, disposed on the inclined portion 1231 of the piezoelectric layer 123, that is, a second electrode 125a, disposed in the extension portion E, may only be disposed in a portion of an inclined surface, rather than the entirety of an inclined surface of the inclined portion 1231.

Figure 12:
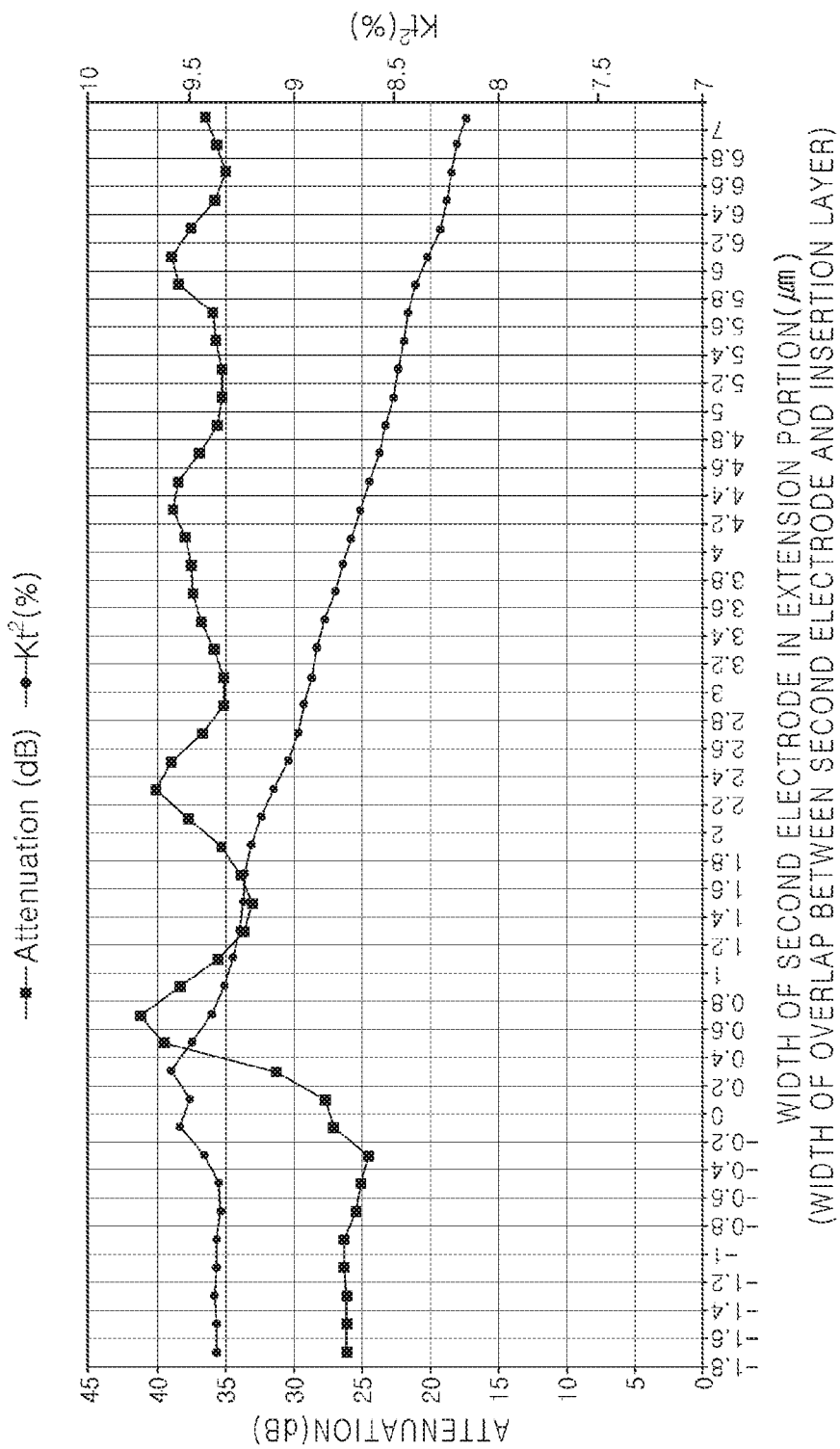
FIG. 12 is a graph illustrating an example of resonance performance of an acoustic resonator, according to a structure of a second electrode of an acoustic resonator in accordance with one or more embodiments.

FIG. 12 is a graph in which a resonance performance such as attenuation of an acoustic resonator according to a structure of a second electrode of an acoustic resonator according to an example is measured and illustrated, and FIG. 13 is a table summarizing a value of the graph illustrated in FIG. 12.

The acoustic resonator, used in the measurement, is an acoustic resonator illustrated in FIGS. 1 to 4, a thickness of the insertion layer 170 is 3000 Å, an inclination angle θ of an inclined surface L of the insertion layer 170 is 20°, and a length ($l_s$, or a width) of the inclined surface L is 0.87 μm.

Here, in an example, an inclined surface of the piezoelectric layer 123 may be formed along an inclined surface of the insertion layer 170, and thus may have the same shape. In this regard, a length of the inclined surface of the piezoelectric layer 123 may be regarded as being equal to a length $l_s$ of the inclined surface L of the insertion layer.

FIG. 12 is a graph in which attenuation of an acoustic resonator is measured while a width $W_e$ of the second electrode 125a disposed in an extension portion E in the acoustic resonator described above is changed.

In FIG. 12, a Y-axis represents attenuation of the acoustic resonator. In the present example, large attenuation of an acoustic resonator means that loss, occurring as a lateral wave flows outwardly of the resonant portion 120, is small. Consequently, it means that a performance of the acoustic resonator is improved.

Moreover, an X-axis represents a width $W_e$ at an end of the second electrode 125a disposed in the extension portion E in the acoustic resonator. Thus, a section in the X-axis, indicated by a positive number, indicates a distance, in which the second electrode 125a and the insertion layer are overlapped within the extension portion E, while a section, indicated by a negative number, indicates a horizontal distance, in which the second electrode 125a is spaced apart from the insertion layer (or an extension portion). Moreover, 0 μm refers to a state in which an end of the second electrode 125a is disposed along a boundary between the center portion S and the extension portion E while the second electrode 125a and the insertion layer 170 are not overlapped.

FIG. 12 illustrates a value of $Kt^2(\%)$ of an acoustic resonator according to a width $W_e$ of a second electrode in an extension portion E. Here, the $Kt^2(\%)$ indicates piezoelectric characteristics for a structure of a resonant portion.

Referring to FIGS. 12 and 13, based on a configuration in which an end of the second electrode 125 is disposed along a boundary the same as the insertion layer 170 (X-axis: 0 μm), as a value of the X-axis increases, characteristics of the attenuation increase. On the contrary, when the value of the X-axis decreases, the second electrode 125 moves far away from a boundary with the insertion layer 170. In this case, attenuation becomes lower, and thus characteristics of the acoustic resonator are degraded.

This is a result of increasing a reflection performance of a lateral wave in the extension portion E. As illustrated in FIG. 3, when the second electrode 125 is located on the inclined surface of the insertion layer 170, a local structure of the acoustic impedance of the resonant portion 120 is a sparse/dense/sparse/dense structure from the center portion S. Thus, a reflective interface for reflecting a lateral wave inwardly of the resonant portion 120 is increased. Thus, most lateral waves could not flow outwardly of the resonant portion 120, and may be reflected and then flow to an interior of the resonant portion 120, thereby improving attenuation characteristics.

Moreover, in an acoustic resonator in which a length $l_s$ of an inclined surface of a piezoelectric layer 123 is 0.87 μm in an extension portion E, when a width $W_e$ of the second electrode 125a, stacked on the inclined surface of the piezoelectric layer 123, is 0.4 μm to 0.8 μm, attenuation is the largest, and this means that loss, caused by the outflow of the lateral wave outwardly of the resonant portion 120, is significantly reduced. Moreover, when the width $W_e$ of the second electrode 125a in the extension portion E is larger or smaller than the width described above, it was measured that attenuation is reduced, and thus a resonance performance is degraded.

On the other hand, considering a ratio $W_e/l_s$ of a width $W_e$ of the second electrode 125 and a length $l_s$ of an inclined surface in the extension portion E, as illustrated in FIG. 13, attenuation is maintained to 38 dB or more in the example of the ratio $W_e/l_s$ between 0.46 and 0.92.

Thus, in order to secure an improved resonance performance, in the acoustic resonator 100 according to an example, a ratio $W_e/l_s$ of a maximum width $W_e$ of the second electrode 125a and the length $l_s$ of the inclined surface within the extension portion E may be defined in a range of 0.46 to 0.92. However, an overall configuration of an example is not limited to the above range, and the range may be changed according to a change in sizes of the inclination angle θ or in thicknesses of the insertion layer 170.

In the example in which the second electrode 125 is disposed in the entirety of the extension portion E over the inclined portion 1231 of the piezoelectric layer 123, as illustrated in FIGS. 12 and 13, when a width $W_e$ of the second electrode 125 in the extension portion E is 2.2 μm, 4.2 μm, or 6 μm, a peak of attenuation was measured.

Moreover, as illustrated in FIG. 12, as an area, in which the second electrode 125 and the insertion layer 170 are overlapped, becomes larger, a value of $Kt^2(\%)$ of the acoustic resonator may be decreased. In this regard, because an inefficient area due to the insertion layer 170 becomes larger, the value of $Kt^2(\%)$ of the acoustic resonator is decreased.

Thus, in order to obtain different values of $Kt^2(\%)$ for each acoustic resonator, an area, in which the insertion layer 170 and the second electrode 125 are overlapped, may be differently applied for each acoustic resonator. Thus, a degree of design freedom may be increased in terms of the filter design.

When an acoustic resonator is used in a humid environment or is left at room temperature for a long period of time, a hydroxyl group (OH group) is adsorbed to the protective layer 127 of the acoustic resonator, and thus a frequency variation may increase due to mass loading or a resonator performance may be degraded.

To solve the problems described above, the protective layer 127 according to an embodiment is formed by stacking at least two different layers 127a and 127b. Moreover, a hydrophobic layer 130 is disposed on a surface of the protective layer 127 and an inner wall of the cavity C.

Figure 18:
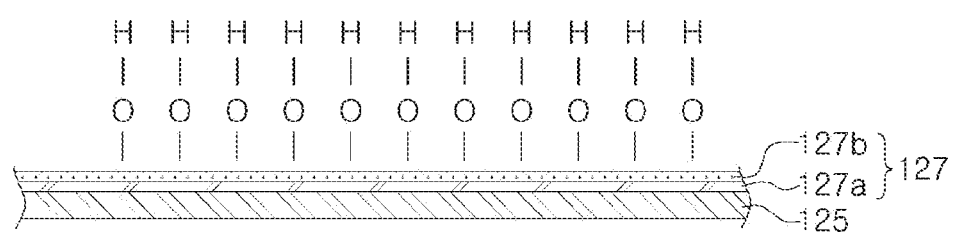
FIG. 18 illustrates that a hydroxyl group is adsorbed onto a protective layer in which a hydrophobic layer is not formed.
Figure 19:
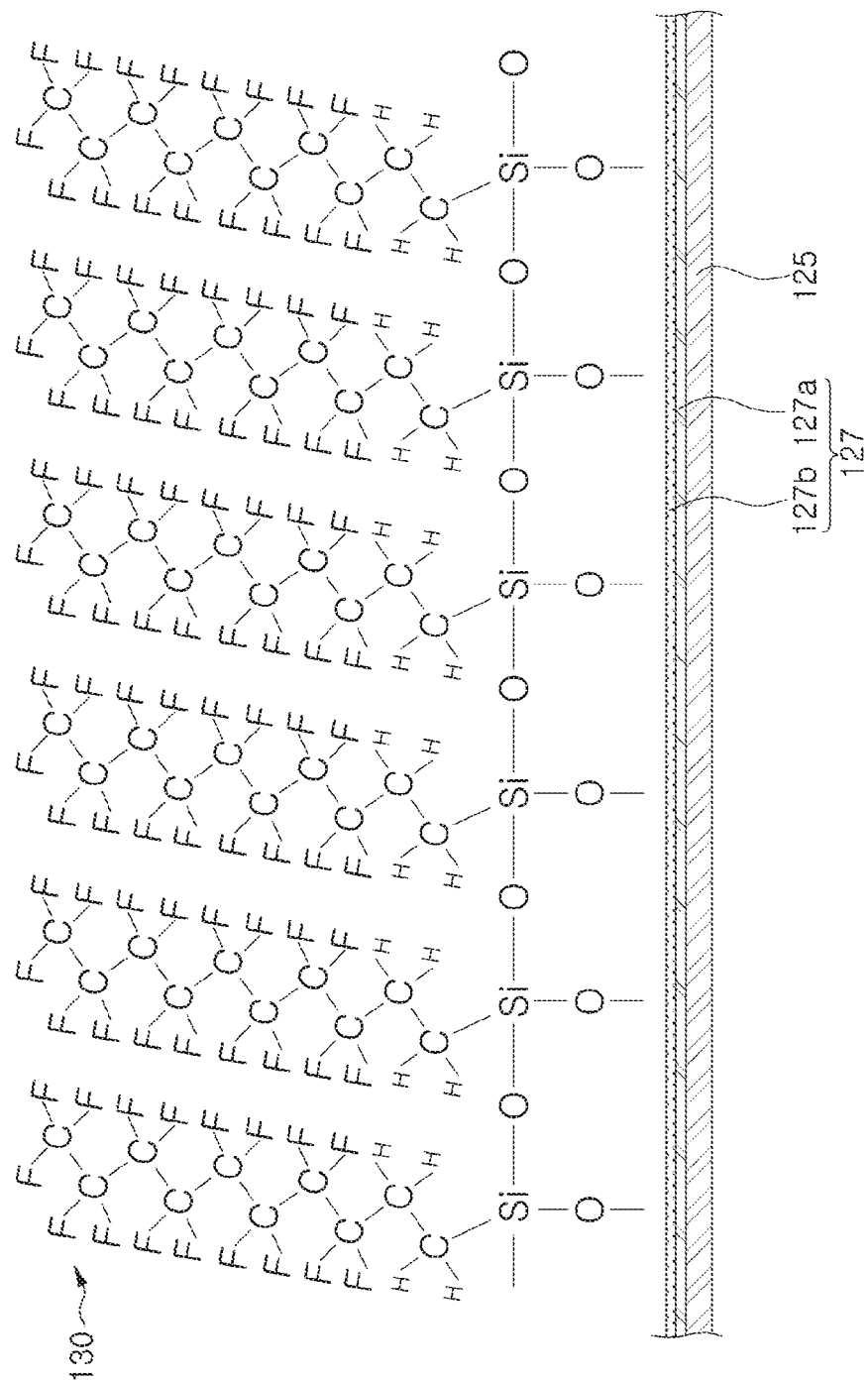
FIG. 19 illustrates an example that a hydrophobic layer is formed on a protective layer.

FIG. 18 illustrates the example in which a hydroxyl group is adsorbed onto a protective layer in which a hydrophobic layer is not formed, and FIG. 19 illustrates the case in which a hydrophobic layer is formed on a protective layer.

Referring to FIG. 19, a protective layer 127 may include a first protective layer 127a, and a second protective layer 127b stacked on the first protective layer 127a. Moreover, a hydrophobic layer 130 may be disposed on the second protective layer 127b.

As illustrated in FIG. 18, in the example in which the hydrophobic layer 130 is not formed on the protective layer 127, when an acoustic resonator is used in a humid environment or is left at room temperature for a long period of time, a hydroxyl group (OH group) is more easily adsorbed to the protective layer 127, and thus hydroxylate may be formed. Since the hydroxylate has high surface energy and is unstable, mass loading occurs because the hydroxylate attempts to lower the surface energy by adsorbing water or the like.

On the other hand, as illustrated in FIG. 19, when the hydrophobic layer 130 is formed on the protective layer 127, the hydroxylate may have low surface energy and is stable. In this regard, it is not necessary to lower the surface energy by adsorbing water and a hydroxyl group (OH group) or the like. Thus, the hydrophobic layer 130 serves to suppress adsorption of water and a hydroxyl group (OH group), thereby significantly reducing a frequency variation and uniformly maintaining a resonator performance.

Figure 20:
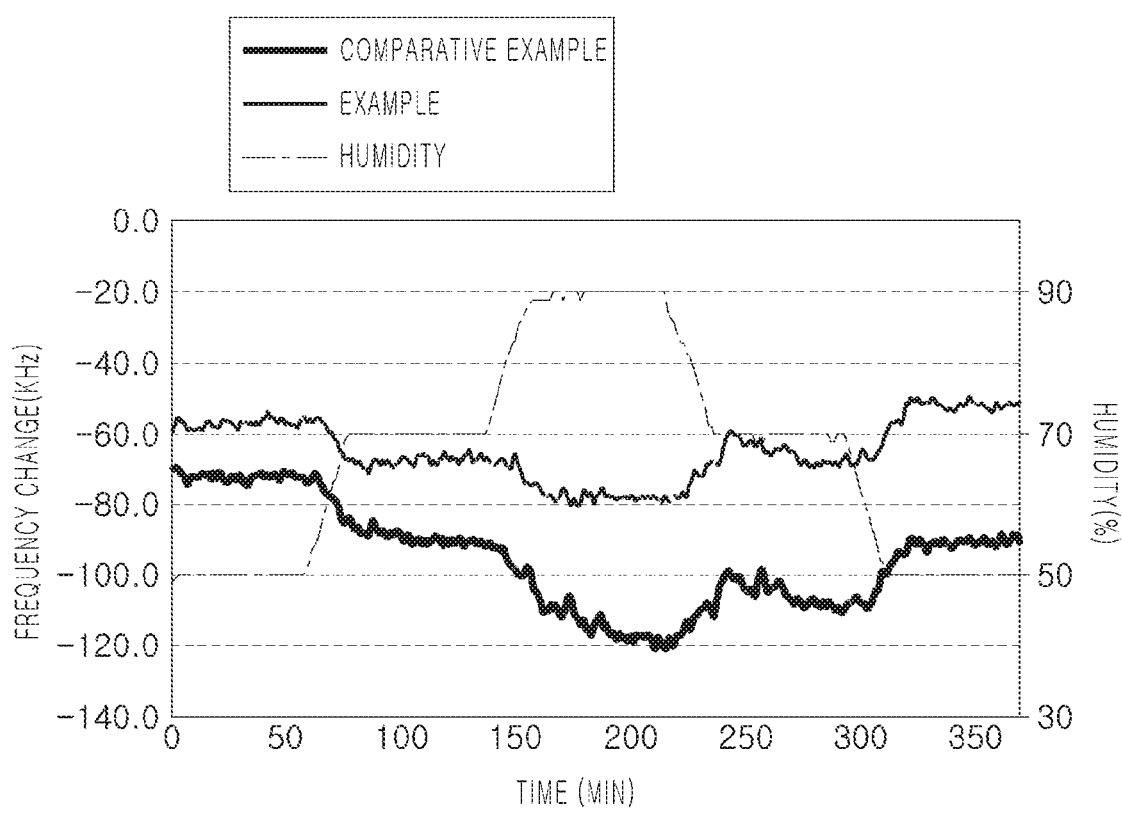
FIG. 20 is a graph illustrating examples of changes in frequencies according to humidity and time, of an acoustic resonator (Example) in which a hydrophobic layer is formed on a protective layer, and an acoustic resonator (Comparative Example) in which a hydrophobic layer is not formed on a protective layer.

FIG. 20 is a graph illustrating changes in frequencies according to humidity and time, of an acoustic resonator (Example) in which a hydrophobic layer is formed on a protective layer, and an acoustic resonator (Comparative Example) in which a hydrophobic layer is not formed on a protective layer. As the experimental method, the Example and the Comparative Example are placed in an absorption chamber, and a change in frequencies is measured while humidity is changed as illustrated in FIG. 20.

Referring to FIG. 20, in the example of an acoustic resonator (Example) in which a hydrophobic layer is formed on a protective layer, a frequency variation according to a change in humidity and time is significantly less. Moreover, in the case of the Example, it was confirmed that a frequency variation at the end of the experiment is smaller than a frequency variation at the start of the experiment.

The hydrophobic layer 130 may be formed of a self-assembled monolayer (SAM) forming material, rather than a polymer. If the hydrophobic layer 130 is formed of a polymer, mass due to the polymer may affect the resonant portion 120. However, since the hydrophobic layer 130 is formed of a self-assembled monolayer in the acoustic resonator according to an embodiment, a change in frequencies of an acoustic resonator may be significantly reduced.

Moreover, if the hydrophobic layer 130 is formed of a polymer, when a hydrophobic layer is formed in the cavity C through the inlet hole (H of FIGS. 1 and 3), a thickness of the hydrophobic layer 130, formed in an inner wall of the cavity C, may become non-uniform. For example, a portion of the hydrophobic layer 130, close to the inlet hole H in the cavity C, may be thick, while a portion of the hydrophobic layer 130, formed in a center portion of the cavity C and far away from the inlet hole H, may be thin.

Moreover, if viscosity of a polymer is high, the polymer could not penetrate smoothly into the cavity C. Thus, there may be a problem in that the hydrophobic layer 130 is not uniformly formed in the cavity C. As described above, if a thickness of the hydrophobic layer 130 is not uniformly formed, a vibration mode of the acoustic resonator is not constant. Thus, an overall resonator Q performance may be degraded.

Moreover, if the thickness of the polymer is significant, resonance in a thickness direction of a resonator is not smoothly performed due to the hydrophobic layer 130. Thus, a resonator Q performance may be degraded.

However, since the hydrophobic layer 130 of an acoustic resonator according to an example is formed of a self-assembled monolayer forming material, a thickness may be uniform according to a position in the cavity C.

Figure 15:
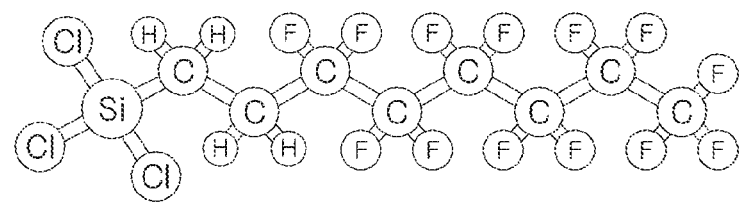
FIG. 15 schematically illustrates an example of a molecular structure of a hydrophobic layer in accordance with one or more embodiments.

The hydrophobic layer 130 may be formed by vapor deposition of a precursor which may have hydrophobicity. In this example, the hydrophobic layer 130 may be deposited as a monolayer having a thickness of 100 Å or less (for example, several A to several tens A). The precursor, which may have hydrophobicity, may be formed using a material in which a contact angle with water is 90° or more after the deposition. For example, the hydrophobic layer 130 may contain a fluorine (F) component, as illustrated in FIG. 15, and may include fluorine (F) and silicon (Si). In detail, fluorocarbon having a silicon head may be used, but an embodiment is not limited thereto.

In order to improve adhesion between a self-assembled monolayer, forming the hydrophobic layer 130, and a protective layer 127, the adhesion layer may be formed on the protective layer before the hydrophobic layer 130 is formed.

The adhesion layer may be vapor-deposited on a surface of the protective layer 127 using a precursor having a hydrophobic functional group.

Figure 14A:
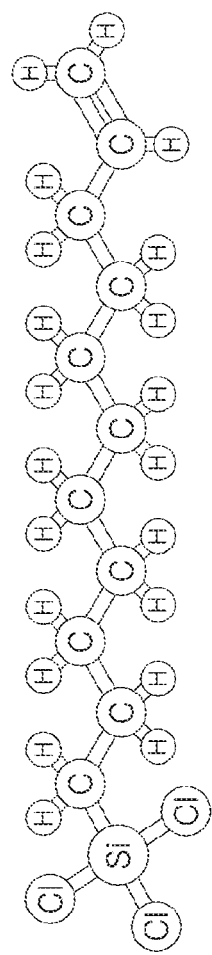
FIGS. 14A and 14B schematically illustrate an example of a molecular structure of a precursor used as an adhesion layer of a hydrophobic layer in accordance with one or more embodiments.
Figure 14B:
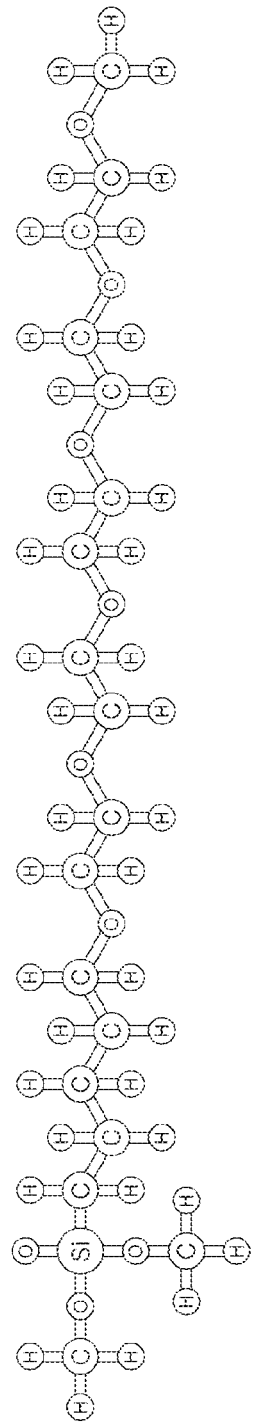

The precursor, used for deposition of the adhesion layer, may be hydrocarbon having a silicon head illustrated in FIG. 14A, or siloxane having a silicon head illustrated in FIG. 14B.

As described later, the hydrophobic layer 130 may be formed after the first metal layer 180 and the second metal layer 190 are formed, and thus may be formed along surfaces of the protective layer 127, the first metal layer 180, and the second metal layer 190.

In the drawings, the example in which the hydrophobic layer 130 is not disposed on surfaces of the first metal layer 180 and the second metal layer 190 is described by way of example, but the examples are not limited thereto. As needed, the hydrophobic layer 130 may also be disposed on surfaces of the first metal layer 180 and the second metal layer 190.

Moreover, the hydrophobic layer 130 may be disposed on not only an upper surface of the protective layer 127, but also an inner surface of the cavity C.

The hydrophobic layer 130, formed in the cavity C, may be formed in the entirety of an inner wall, forming the cavity C. Accordingly, a hydrophobic layer 130 is also formed in a lower surface of the membrane layer 150, forming a lower surface of the resonant portion 120.

In this example, it is suppressed that a hydroxyl group may be adsorbed on a lower portion of the resonant portion 120.

The adsorption of the hydroxyl group occurs not only in the protective layer 127 but also in the cavity C. Thus, in order to significantly reduce mass loading, caused by adsorption of the hydroxyl group, and frequency drop thereby, it is preferable to block the adsorption of the hydroxyl group not only in the protective layer 127 but also in a lower surface of the resonant portion, that is, an upper surface of the cavity C (a lower surface of a membrane layer).

In addition, when the hydrophobic layer 130 is formed on an upper surface and a lower surface or a side surface of the cavity C as in an example, an effect of suppressing the occurrence of a stiction phenomenon, a phenomenon in which a resonant portion 120 is adhered to an insulating layer 115 due to surface tension in a wet process or a cleaning process after formation of the cavity C, may be provided.

Here, in this embodiment, the example in which the hydrophobic layer 130 is formed in the entirety of an inner wall of the cavity C is described by way of example, but the example is not limited thereto. Alternatively, various modifications are possible. For example, a hydrophobic layer may only be formed on an upper surface of the cavity C, or the hydrophobic layer 130 may only be formed in at least a portion of a lower surface and a side surface of the cavity C.

Moreover, in an example, the protective layer 127 includes a first protective layer 127a disposed along a surface formed by the second electrode 125, the bent portion 123b of the piezoelectric layer 123, and the insertion layer 170, as well as a second protective layer 127b stacked on the first protective layer 127a.

The first protective layer 127a may be used for frequency trimming, and thus may be formed of a material suitable for frequency trimming. For example, the first protective layer 127a may be formed of one among silicon dioxide ($SiO_2$), silicon nitride ($Si_3N_4$), amorphous silicon (a-Si), and polycrystalline silicon (p-Si).

In the example of silicon dioxide ($SiO_2$), silicon nitride ($Si_3N_4$), amorphous silicon (a-Si), and polycrystalline silicon (p-Si), there may be a disadvantage in that the hydroxyl group is easily adsorbed during a wet process, which is a subsequent process. The reason for this result is that a membranous layer of a thin film of silicon dioxide ($SiO_2$), silicon nitride ($Si_3N_4$), amorphous silicon (a-Si), polycrystalline silicon (p-Si), or the like, is not dense, so the absorption of a hydroxyl group occurs in many sites, not only a surface but also an interior of a thin film. Thus, in an example, a material, which is difficult to adsorb a hydroxyl group, may be stacked on the first protective layer 127a, to form the second protective layer 127b.

Accordingly, the second protective layer 127b may be formed of a material having a density higher than a density of the first protective layer 127a. For example, the second protective layer 127b may be formed of one among aluminum oxide ($Al_2O_3$) aluminum nitride (AlN), magnesium oxide (MgO), titanium oxide ($TiO_2$), zirconium oxide ($ZrO_2$), and zinc oxide (ZnO), but is not limited thereto.

Since a membranous layer of the second protective layer 127b is denser than that of the first protective layer 127a, the absorption of a hydroxyl group may only occur on a surface of the second protective layer 127b.

Table 1 below illustrates results of a reliability test, in high temperature/high humidity environments, of an acoustic resonator having a double protective layer according to an example, and an acoustic resonator having a single protective layer.

TABLE 1

| Protective layer | Material | Hydrophobic layer | Test time (Hr) | Frequency variation of acoustic resonator (Mhz) |
|---|---|---|---|---|
| Single protective layer | $SiO_2$ | X | 48 | 0.9 |
| | | O | | 0.7 |
| | $Si_3N_4$ | X | | 0.7 |
| | | O | | 0.5 |
| Double protective layer | $Si_3N_4$ $Al_2O_3$ | O | 96 | 0.3 |

Referring to Table 1, when a first protective layer 127a is formed of silicon dioxide ($SiO_2$) to have a thickness of 2000 Å without a hydrophobic layer 130, as a result of a reliability test in high temperature, high humidity, and high-pressure environments, a frequency variation of the resonant portion 120 was measured at 0.9 Mhz. In addition, when a hydrophobic layer 130 is formed on the first protective layer 127a described above, a frequency variation of the resonant portion 120 was measured at 0.7 Mhz.

Moreover, when a first protective layer 127a is formed of silicon nitride ($Si_3N_4$) to have a thickness of 2000 Å without a hydrophobic layer 130, as a result of a reliability test, a frequency variation of the resonant portion 120 was measured at 0.7 Mhz. In addition, as a result of measurement after formation of the hydrophobic layer 130, the frequency variation was measured at 0.5 Mhz.

As described above, when the hydrophobic layer 130 is formed on a single protective layer, a frequency variation is reduced, but it may be difficult to confirm that the reduction is significant.

On the other hand, as in an example, when the first protective layer 127a is formed of silicon nitride ($Si_3N_4$) to have a thickness of 2000 Å, the second protective layer 127b is formed of aluminum oxide ($Al_2O_3$) to have a thickness of 500 Å, and a hydrophobic layer 130 is disposed on the second protective layer 127b, a frequency variation of the resonant portion 120 was measured at 0.3 Mhz.

Thus, when the protective layer 127 is formed of a plurality of layers having different levels of density, and the hydrophobic layer 130 is stacked thereabove, it was confirmed that a frequency variation due to the absorption of the hydroxyl group is significantly improved.

Moreover, when a frequency variation is about 0.3 Mhz in a reliability test environment, the effect of the adsorption of the hydroxyl group on the resonant portion is not significant. Thus, in order to block penetration of moisture into the resonant portion 120 and maintain the hermetic sealing of the resonant portion, it may not be necessary to seal the resonant portion 120 with a separate sealing member. Thus, it is not necessary to add other components in order to secure the hermetic sealing of the resonant portion 120, so manufacturing may be easily performed and manufacturing costs may also be reduced compared to the related art.

In an embodiment, the second protective layer 127b may be disposed in the cavity C. However, the examples are not limited thereto, and the second protective layer may be configured to be only disposed on an outer surface of an acoustic resonator while not disposed in the cavity C, as in an embodiment of FIG. 9 to be described later.

Filter

Figure 16:
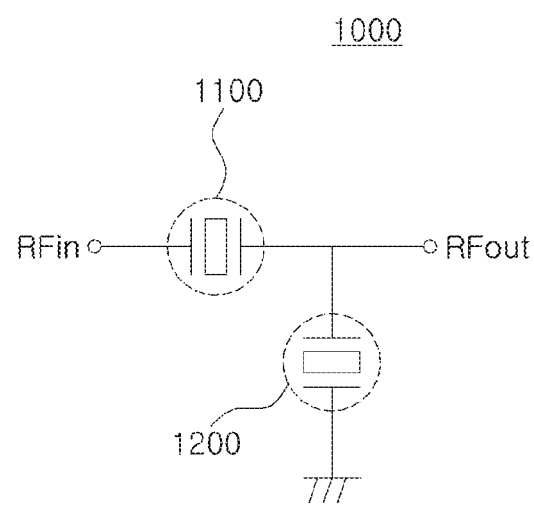
FIGS. 16 and 17 are schematic circuit diagrams of examples of filters in accordance with one or more embodiments, respectively.
Figure 17:
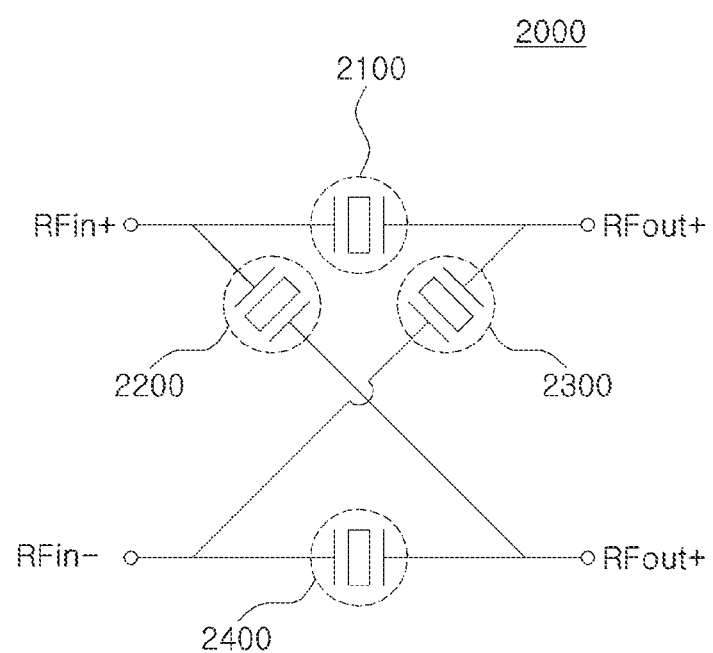

FIGS. 16 and 17 are schematic circuit diagrams of filters according to examples, respectively.

Each of a plurality of bulk acoustic resonators, applied to filters of FIGS. 16 and 17, may correspond to the acoustic resonator illustrated in FIG. 2.

Referring to FIG. 16, a filter 1000 according to another example may be provided to have a ladder type filter structure. In detail, the filter 1000 may include a plurality of acoustic resonators 1100 and 1200.

The first acoustic resonator 1100 may be connected in series between a signal input terminal into which an input signal RFin is input, and a signal output terminal from which an output signal RFout is output, while the second acoustic resonator 1200 may be connected between the signal output terminal and a ground.

Referring to FIG. 17, a filter 2000 according to another example may be formed to have a lattice type filter structure. In detail, the filter 2000 includes a plurality of acoustic resonators 2100, 2200, 2300, and 2400, and filters balanced input signals RFin+ and RFin- to output balanced output signals RFout+ and RFout-.

Moreover, the filter may be formed to have a filter structure in which the ladder type filter structure of FIG. 16 and the lattice type filter structure of FIG. 17 are combined with each other.

Method of Manufacturing Acoustic Resonator

Next, a method of manufacturing an acoustic resonator according to the present example will be described.

FIGS. 5 to 8 are views illustrating a method of manufacturing an acoustic resonator according to an example.

Figure 5:
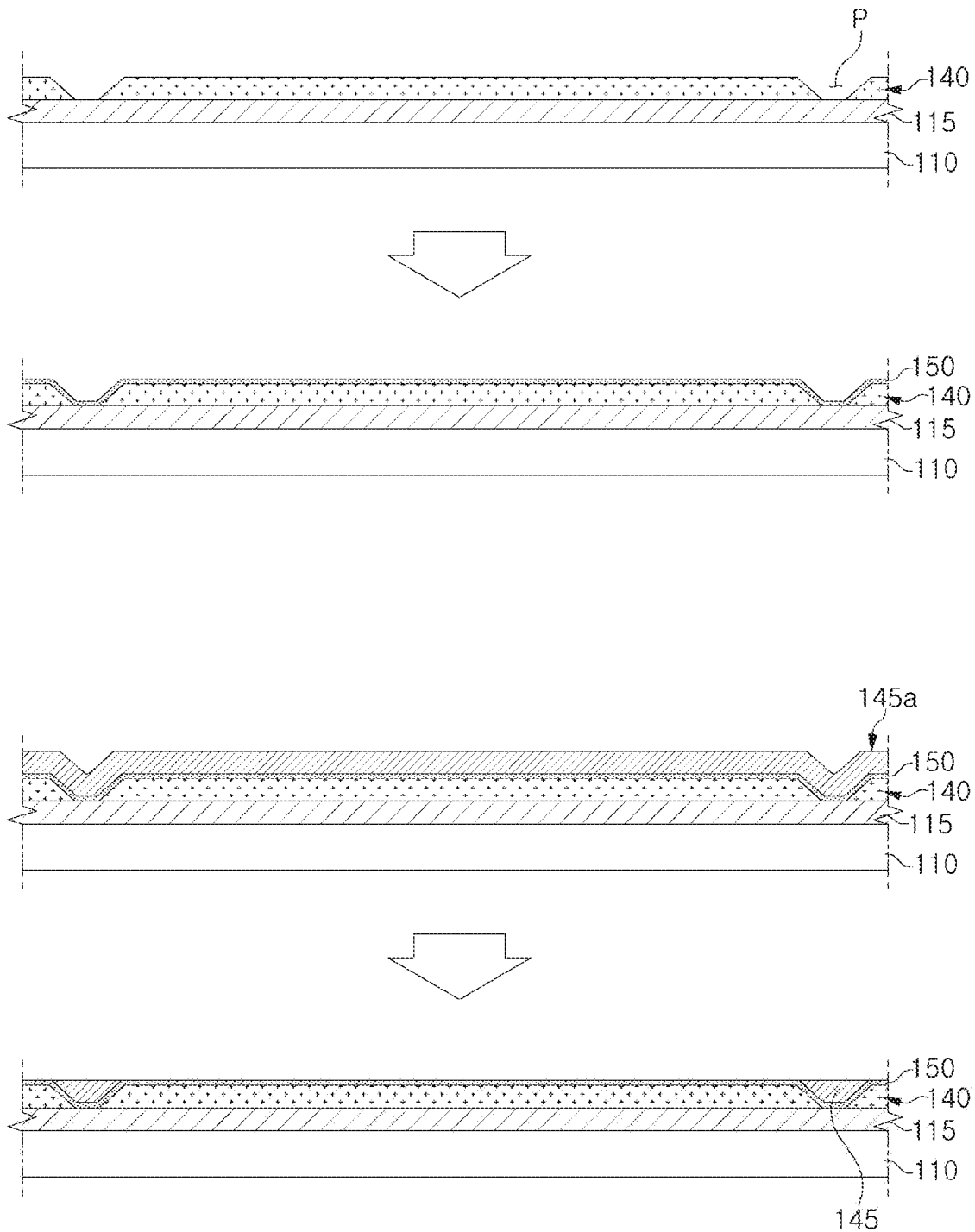
FIGS. 5 to 8 are views illustrating an example of a method of manufacturing an acoustic resonator in accordance with one or more embodiments.

First, referring to FIG. 5, in a method of manufacturing an acoustic resonator according to an example, an insulating layer 115, and a sacrificial layer 140 are first formed on a substrate 110, and then a pattern P, passing through the sacrificial layer 140, is provided. Thus, the insulating layer 115 may be exposed externally through the pattern P.

The insulating layer 115 may be formed of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide (TiO$_2$), zinc oxide (ZnO), silicon nitride (Si$_3$N$_4$), silicon oxide (SiO$_2$), or the like, but is not limited thereto.

The pattern P, formed in the sacrificial layer 140, may be formed to have a cross section in the form of a trapezoid, in which a width of an upper surface is wider than a width of a lower surface.

A portion of the sacrificial layer 140 may be removed through a subsequent etching process to form the cavity (C of FIG. 2). Thus, the sacrificial layer 140 may be formed of a material, which can be easily etched, such as polysilicon or polymer. The present examples are not, however, limited thereto.

Then, a membrane layer 150 is formed on the sacrificial layer 140. The membrane layer 150 may be formed to have a constant thickness along a surface of the sacrificial layer 140. The thickness of the membrane layer 150 may be less than a thickness of the sacrificial layer 140, but is not so limited.

The membrane layer 150 may include at least one between silicon dioxide (SiO$_2$) and silicon nitride (Si$_3$N$_4$). Moreover, the membrane layer 150 may include a dielectric layer including at least one among magnesium oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), or a metal layer including at least one among aluminum (Al), nickel (Ni), chrome (Cr), platinum (Pt), gallium (Ga), hafnium (Hf), and titanium (Ti). The configuration of an embodiment is not, however, limited thereto.

Meanwhile, although not illustrated, a seed layer may be formed on the membrane layer 150.

The seed layer may be disposed between the membrane layer 150, and a first electrode 121, to be described later. The seed layer may be formed of aluminum nitride (AlN), but is not limited thereto. Alternatively, the seed layer may be formed using a dielectric or metal having an HCP structure. For example, when the seed layer is formed of the metal, the seed layer may be formed of titanium (Ti).

Then, an etch-stop layer 145a is formed on the membrane layer 150. An interior of the pattern P is filled with the etch-stop layer 145a.

The etch-stop layer 145a may be formed to have a thickness that completely fills the pattern P. Thus, the etch-stop layer 145a may be formed to be thicker than the sacrificial layer 140.

The etch-stop layer 145a may be formed of a material that is the same as that of the insulating layer 115, but is not limited thereto.

Then, the etch-stop layer 145a is removed to expose the membrane layer 150 externally.

In this example, a portion of the etch-stop layer, filled in the interior of the pattern P, remains, and the remaining portion of the etch-stop layer 145a may serve as the etch-stop portion 145.

Figure 6:
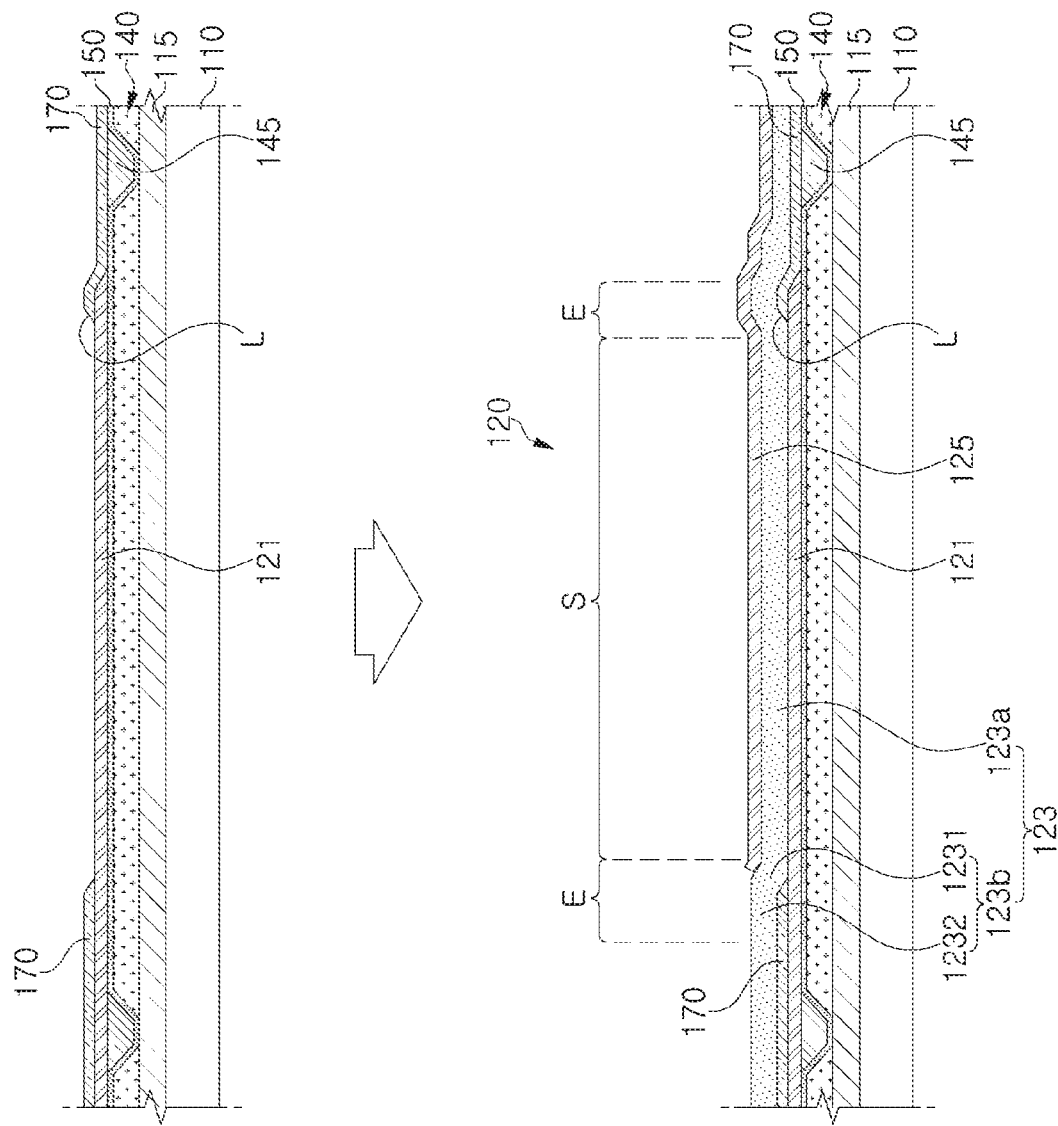

Then, as illustrated in FIG. 6, a first electrode 121 is formed on an upper surface of the membrane layer 150.

In an embodiment, the first electrode 121 may be formed of a conductor, for example, gold, copper, molybdenum, ruthenium, iridium, aluminum, platinum, titanium, tungsten, palladium, tantalum, chromium, nickel, an aluminum alloy, or a metal containing at least one among them, but are not limited thereto.

The first electrode 121 may be formed on an upper portion of a region in which the cavity (C of FIG. 3) is to be formed.

The first electrode 121 is formed by removing an unnecessary portion, after a conductor layer is provided in the form of covering the entirety of the membrane layer 150.

Then, the insertion layer 170 may be formed as needed. The insertion layer 170 is formed on the first electrode 121, and may be extended to an upper portion of the membrane layer 150, if necessary. When the insertion layer 170 is formed, the extension portion E of the resonant portion 120 is formed to have a thickness greater than a thickness of the center portion S, and thus functions as a reflection region, which is dense as compared with the center portion S. Thus, vibration, generated in the center portion S, is suppressed from flowing to an outer edge, so a Q-factor of the acoustic resonator may be increased.

The insertion layer 170 is formed to cover the entirety of a surface formed by the membrane layer 150, the first electrode 121, and the etch-stop portion 145, and then is completed by removing a region corresponding to the center portion S, and a portion disposed in an unnecessary region.

Accordingly, a central portion of the first electrode 121, that forms the center portion S, may be exposed to a side surface of the insertion layer 170. Moreover, the insertion layer 170 may be formed to cover a portion of the first electrode 121 along a periphery of the first electrode 121. Thus, an edge portion of the first electrode 121, disposed in the extension portion E, is disposed in a lower portion of the insertion layer 170.

A side surface of the insertion layer 170, disposed adjacent to the center portion S, may be provided as an inclined surface L. The insertion layer 170 may have a thickness which becomes less as the inclined surface of the insertion layer 170 approaches the center portion S, and thus a lower surface of the insertion layer 170 is provided to be further extended toward the center portion S, as compared with an upper surface of the insertion layer 170. In this example, an inclination angle of the inclined surface L of the insertion layer 170 may be formed in the range of 5° to 70° as described previously.

The insertion layer 170 may be formed of, for example, a dielectric material such as silicon oxide (SiO$_2$), aluminum nitride (AlN), aluminum oxide (Al$_2$O$_3$), silicon nitride (Si$_3$N$_4$), magnesium oxide (MgO), zirconium oxide (ZrO$_2$), lead zirconate titanate (PZT), gallium arsenide (GaAs), oxide hafnium (HfO$_2$), aluminum oxide (Al$_2$O$_3$), titanium oxide (TiO$_2$), zinc oxide (ZnO), and the like, and may be formed of a material different from that of the piezoelectric layer 123. Also, if necessary, the insertion layer 170 may be formed of a metal material. In this example, the insertion layer 170 may be formed of aluminum or an aluminum alloy.

Then, a piezoelectric layer 123 is formed on the first electrode 121 and the insertion layer 170.

In the present example, the piezoelectric layer 123 may be formed of aluminum nitride (AlN). However, it is not limited thereto, and zinc oxide (ZnO), doped aluminum nitride, lead zirconate titanate, and quartz may be selectively used as a material of the piezoelectric layer 123. In the case of the doped aluminum nitride, a rare earth metal, a transition metal, or an alkaline earth metal may be further included. For example, the rare earth metal may include at least one among scandium (Sc), erbium (Er), yttrium (Y), and lanthanum (La). The transition metal may include at least one among hafnium (Hf), titanium (Ti), zirconium (Zr), tantalum (Ta), and niobium (Nb). Moreover, the alkaline earth metal may include magnesium (Mg).

Moreover, the piezoelectric layer 123 may be formed of a material that is different from a material of the insertion layer 170.

The piezoelectric layer 123 may be formed by partially removing an unnecessary portion, after a piezoelectric material is formed in the entirety of a surface, formed by the first electrode 121 and the insertion layer 170. In an embodiment, after the second electrode 125 is formed, the unnecessary portion of the piezoelectric material is removed to complete the piezoelectric layer 123. However, it is not limited thereto, and the piezoelectric layer 123 may be completed before the second electrode 125 is formed.

The piezoelectric layer 123 may be formed to cover the first electrode 121 and the insertion layer 170, and thus may be formed along a shape of a surface formed by the first electrode 121 and the insertion layer 170.

As described above, a portion of the first electrode 121, corresponding to the center portion S, may be exposed to a side surface of the insertion layer 170. Thus, in the center portion S, the piezoelectric layer 123 may be stacked on an upper surface of the first electrode 121. Moreover, in the extension portion E, the piezoelectric layer may be stacked on the insertion layer 170.

Then, a second electrode 125 is formed on an upper portion of the piezoelectric layer 123. In an example, the second electrode 125 may be formed of a conductor, for example, gold, copper, molybdenum, ruthenium, iridium, aluminum, platinum, titanium, tungsten, palladium, tantalum, chromium, nickel, an aluminum alloy, or a metal containing at least one among them, but is not limited thereto.

The second electrode 125 may be disposed on the piezoelectric portion 123a and the inclined portion 1231 of the piezoelectric layer 123. Moreover, as described above, the second electrode 125 may be disposed in the entirety of the center portion S and may be partially disposed in the extension portion E. The second electrode 125 may be partially disposed in the extension portion E, thereby providing a remarkably improved resonance performance.

Figure 7:
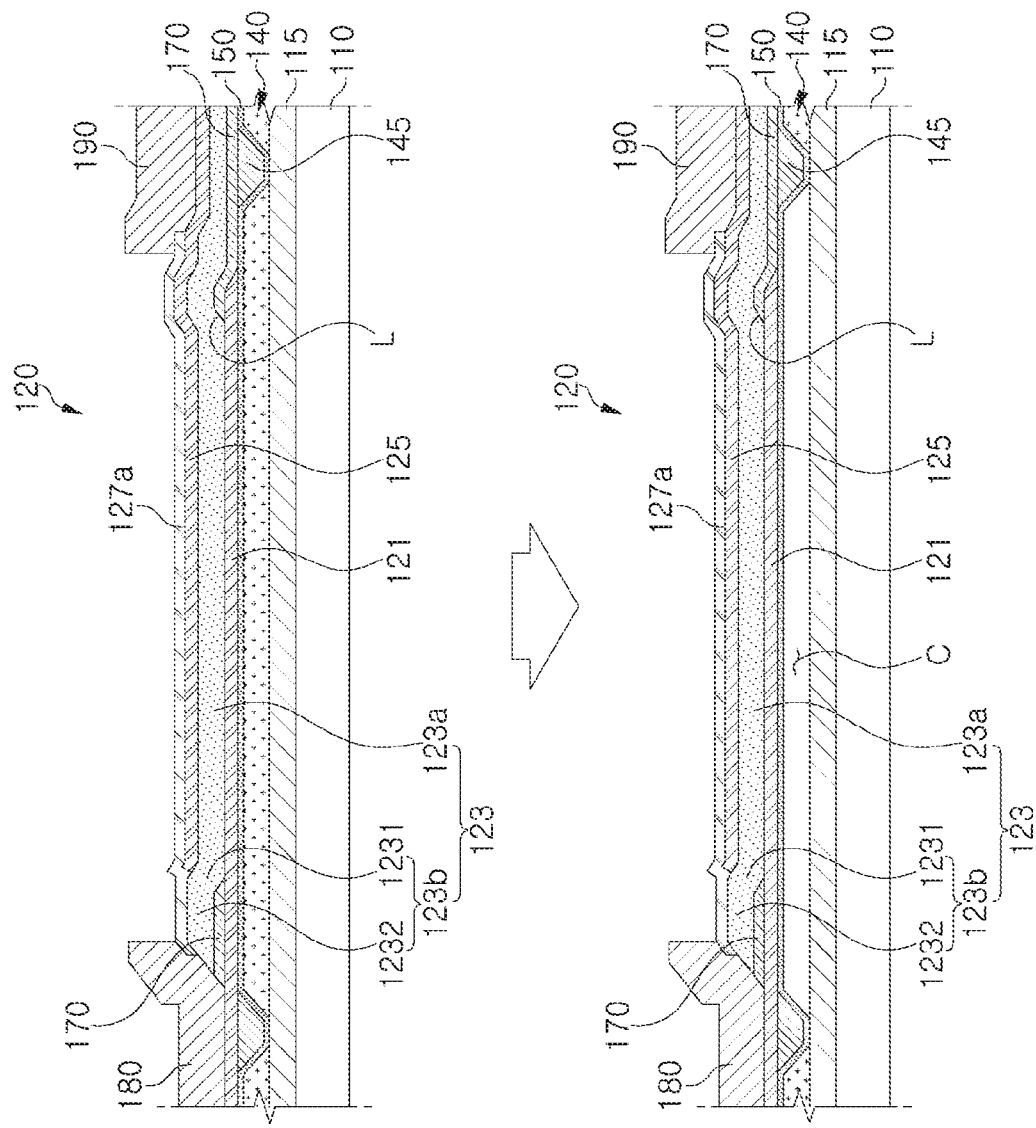

Then, as illustrated in FIG. 7, a first protective layer 127a is formed.

The first protective layer 127a may be formed along a surface formed by the second electrode 125 and the piezoelectric layer 123. The first protective layer 127a may be manufactured by forming a thin film in the entirety of an upper surface of an acoustic resonator, in which the second electrode 125 is formed, and then removing an unnecessary portion.

Ultimately, the first protective layer 127a may only be disposed in a resonant portion, but is not limited thereto. Alternatively, the first protective layer may be disposed in the entirety or a portion, of an upper surface of the acoustic resonator, except for the first metal layer 180 and the second metal layer 190.

The first protective layer 127a may be formed of one among silicon-oxide-based and silicon-nitride-based insulating materials, but is not limited thereto.

For example, the first protective layer 127a may be formed of one among silicon dioxide ($SiO_2$), silicon nitride ($Si_3N_4$), amorphous silicon (a-Si), and polycrystalline silicon (p-Si).

Then, the first protective layer 127a and the piezoelectric layer 123 are partially removed to partially expose the first electrode 121 and the second electrode 125, and a first metal layer 180 and a second metal layer 190 are formed in exposed portions, respectively.

The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum alloy, or the like, and may be formed to be deposited on the first electrode 121 or the second electrode 125, but an embodiment is not limited thereto.

Then, a cavity C is formed.

The cavity C is formed by removing a portion of the sacrificial layer 140, located in the etch-stop portion 145, and the sacrificial layer 140, removed in the process described above, may be removed using an etching method.

When the sacrificial layer 140 is formed of a material such as polysilicon or polymer, the sacrificial layer 140 may be removed through a dry etching method using a halide-based etching gas (for example, xenon difluoride ($XeF_2$)), such as fluorine (F), chlorine (Cl), or the like.

Figure 8:
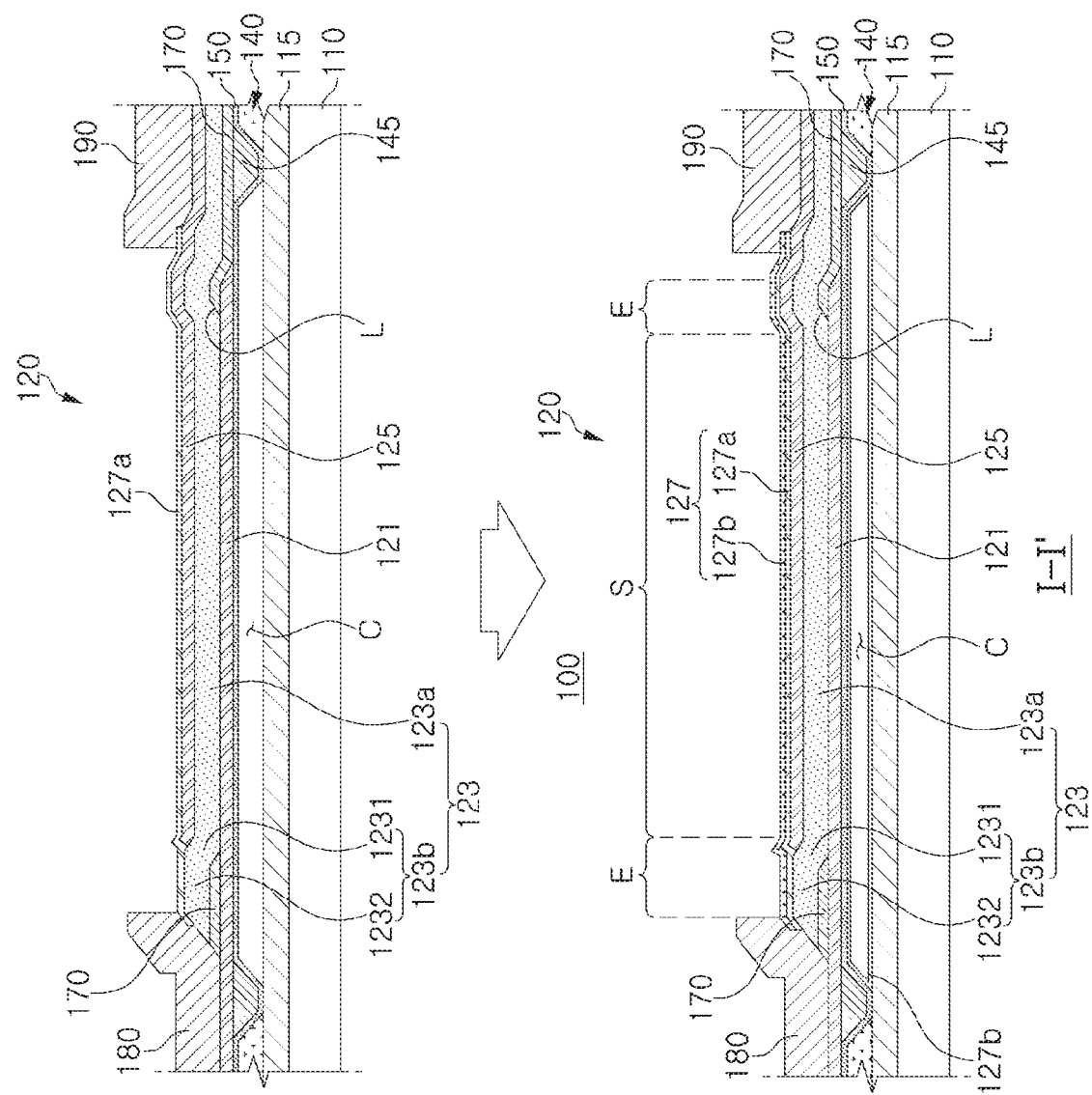

Then, as illustrated in FIG. 8, in order to obtain the desired frequency characteristics, a trimming process for partially removing the first protective layer 127a through a wet process may be performed. The trimming process may be performed to allow a thickness of the first protective layer 127a to be reduced.

When the trimming process is completed, a process for stacking a second protective layer 127b on the first protective layer 127a may be performed. As described above, the second protective layer 127b may be formed of a material having a density higher than that of the first protective layer 127a, and aluminum oxide ($Al_2O_3$) is used in an example. The present disclosure is not, however, limited thereto.

The second protective layer 127b may be formed to have a thickness less than that of the first protective layer 127a, and may be formed using a method such as vapor deposition.

The second protective layer 127b may be disposed on the first protective layer 127a, but may also be disposed on a region in which the first protective layer 127a is not disposed, if necessary. For example, the cavity C is formed in the acoustic resonator in a process of forming the second protective layer 127b, so the second protective layer 127b may be also formed in an inner wall of the cavity C.

Then, as the hydrophobic layer 130 is formed on the second protective layer 127b, the acoustic resonator 100, illustrated in FIGS. 2 and 3, is completed.

The hydrophobic layer 130 may be formed by depositing a hydrophobic material using a chemical vapor deposition (CVD) method.

Figure 21:
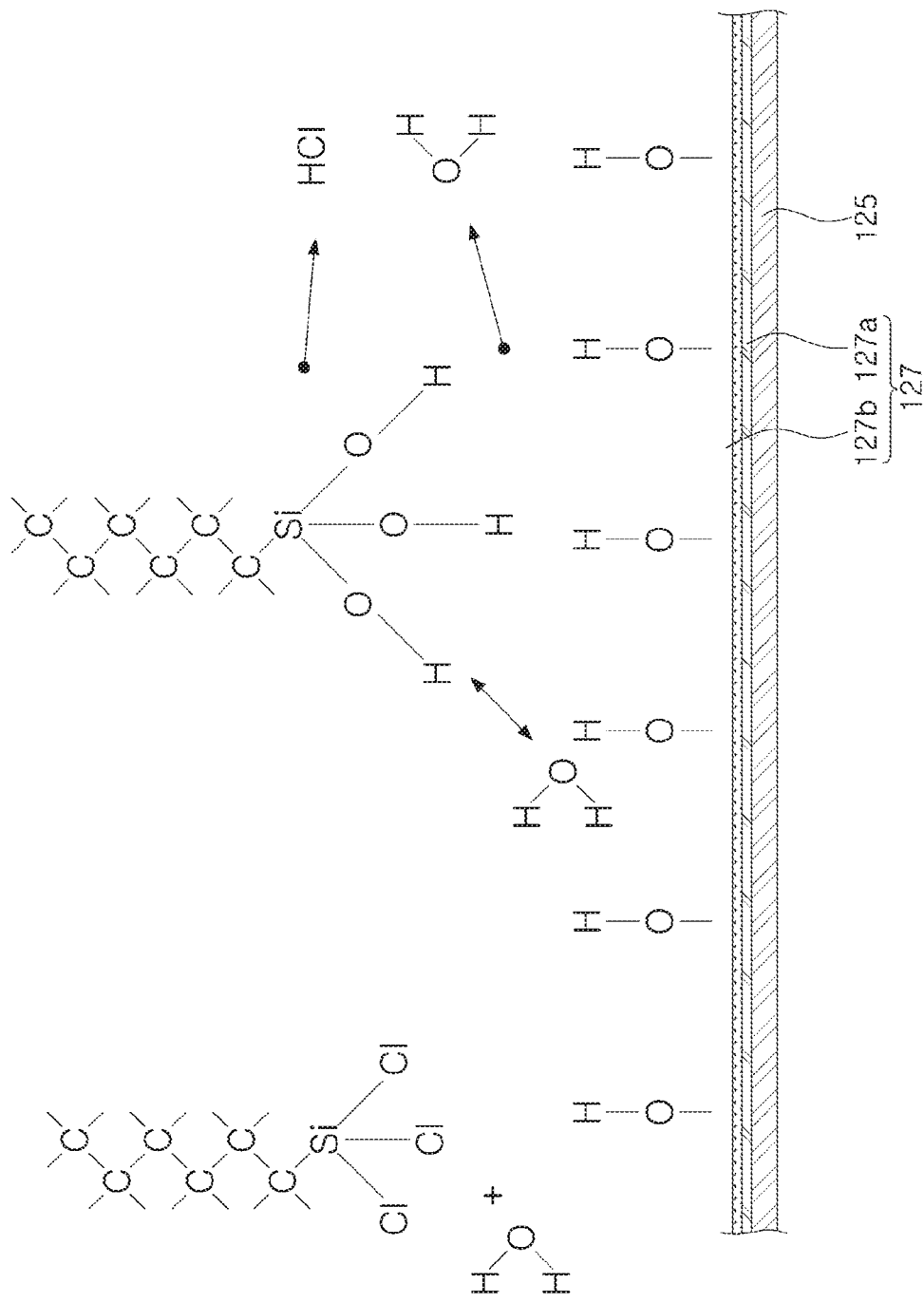
FIG. 21 schematically illustrates an example of a process in which a hydrophobic layer is formed on a protective layer.

In the process, as illustrated in FIG. 21, an entire surface of an acoustic resonator, including the second protective layer 127b, is hydroxylated, a precursor having a silicon head is used to perform a hydrolyze silane reaction so as to surface-treat a surface of the acoustic resonator, thereby generating the adhesion layer described above.

Thereafter, when a fluorocarbon functional group is formed on the surface of the acoustic resonator, which is surface-treated, a hydrophobic layer 130 is formed on a surface of the acoustic resonator as illustrated in FIG. 19.

Alternatively, the surface treatment may be omitted depending on a surface material of an acoustic resonator, and a fluorocarbon functional group may be directly formed to form a hydrophobic layer 130.

In the manufacturing process, the hydrophobic layer 130 may also be formed in an inner wall of the cavity C through the inlet holes (H of FIGS. 1 and 3).

As described above, the hydrophobic layer 130 may be formed in the entirety of a surface, in which vapor deposition could be performed in the process, of a surface of the acoustic resonator. However, it is not limited thereto, and the hydrophobic layer may be partially formed, if necessary. For example, the hydrophobic layer 130 may only be formed on an upper surface of the second protective layer 127b, forming an upper surface of the resonant portion 120, and a lower surface of the membrane layer 150, forming a lower surface of the resonant portion.

As described above, the hydrophobic layer 130 may be formed of a self-assembled monolayer (SAM) forming material. Thus, mass loading applied to the resonant portion 120 may be prevented due to the hydrophobic layer 130, and a thickness of the hydrophobic layer 130 may be uniformly formed.

Meanwhile, the acoustic resonator according to an embodiment is not limited to the above-mentioned example, and may be modified in various ways.

Figure 9:
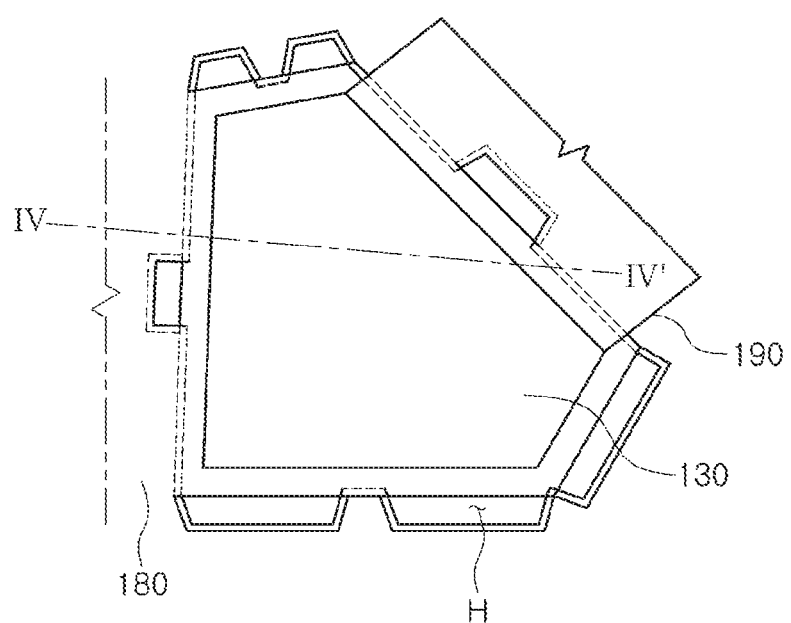
FIG. 9 is an example of a plan view of an acoustic resonator in accordance with one or more embodiments.
Figure 10:
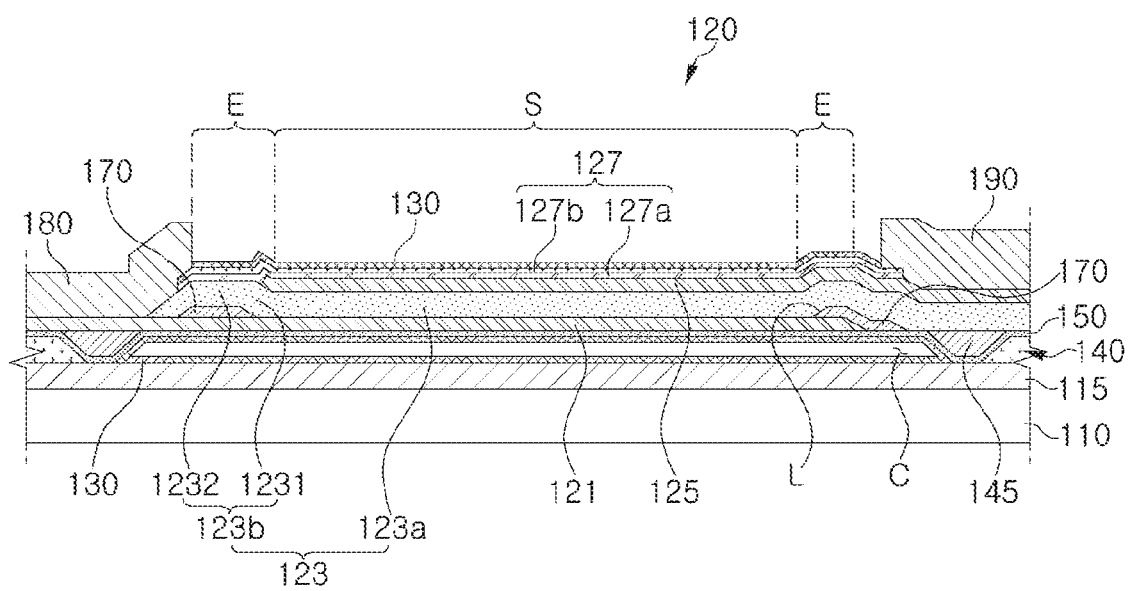
FIG. 10 is an example of a cross-sectional view taken along line IV-IV' of FIG. 9.

FIG. 9 is a plan view illustrating an acoustic resonator according to another embodiment, and FIG. 10 is a cross-sectional view taken along line IV-IV' of FIG. 9.

Referring to FIGS. 9 to 10, an acoustic resonator 200 according to an example is configured to have a plane of a resonant portion 120 with an asymmetric polygonal shape. In this example, a separation distance from other acoustic resonators disposed adjacent thereto may be significantly reduced. Accordingly, when a plurality of acoustic resonators is disposed on a substrate to form a module, an overall size of the module may be reduced.

In an embodiment, an asymmetric polygon refers to a polygon which is not symmetric with respect to one point within a polygon, a polygon which is not symmetric with respect to a line passing through a polygon, or a polygon in which sides opposing each other are not parallel to each other.

Moreover, a portion of the insertion layer 170 of an acoustic resonator according to an example, supporting the piezoelectric layer 123, is left, and all remaining portions are removed from the resonant portion 120. As described above the insertion layer 170 may be partially disposed, as necessary.

When the acoustic resonator is configured as described above, the insertion layer 170 may be disposed not to be in contact with the first metal layer 180 or the etch-stop portion 145. Moreover, the insertion layer 170 may not be disposed outwardly of the resonant portion 120, but may instead be disposed within an upper region of the cavity C. However, the region, in which the insertion layer 170 is disposed, is not limited to a region illustrated in each of FIGS. 9 and 10, and may be extended to various positions as necessary.

Moreover, in an acoustic resonator according to an example, a second protective layer 127b may not be disposed in the cavity C, and a hydrophobic layer 130 may be directly disposed on an inner wall of the cavity C, formed by the membrane layer 150 and the insulating layer 115.

The second protective layer 127b may be formed first, and the cavity C and the hydrophobic layer 130 may be sequentially formed thereafter, so the configuration described above may be implemented. In this example, unnecessary elements may not be placed inside the cavity C, so a performance of the acoustic resonator may be increased.

Figure 11:
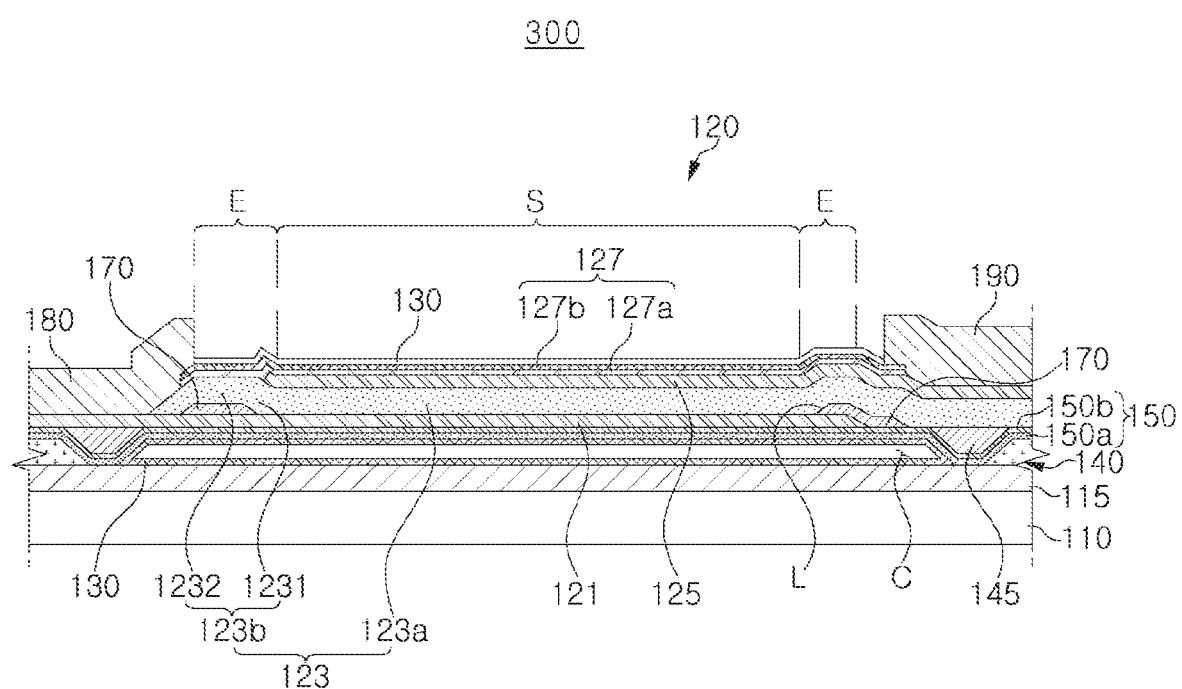
FIG. 11 is an example of a plan view of an acoustic resonator in accordance with one or more embodiments.

FIG. 11 is a cross-sectional view of an acoustic resonator according to another embodiment, and illustrates a cross-sectional view taken along line IV-IV' of FIG. 9.

Referring to FIG. 11, in an acoustic resonator 300 according to an example, a membrane layer 150 includes a first membrane layer 150a and a second membrane layer 150b.

The first membrane layer 150a is formed on the sacrificial layer 140, while the second membrane layer 150b is stacked on the first membrane layer 150a. Thus, the second membrane layer 150b is disposed between the first electrode and the first membrane layer 150a to support the first electrode 121, while the first membrane layer 150a is disposed along a surface (for example, a lower surface) of the second membrane layer 150b.

The second membrane layer 150b may be formed of a silicon oxide-based or silicon nitride-based insulating material.

For example, the second membrane layer 150b may be formed of a material, the same as that of the membrane layer (150 of FIG. 2) according to the embodiment described above, such as silicon dioxide ($SiO_2$), silicon nitride ($Si_3N_4$), or the like. In addition, the second membrane layer may be formed of one between amorphous silicon (a-Si) and polycrystalline silicon (p-Si), but is not limited thereto.

In a manner similar to the first protective layer 127a, in the second membrane layer 150b, a membranous layer of a thin film is not dense, so the absorption of the hydroxyl group may occur not only in a surface but also in an interior of a thin film. Thus, a hydroxyl group may be easily adsorbed during a wet process.

Thus, in an embodiment, a first membrane layer 150a, formed of a material, which is difficult to adsorb a hydroxyl group, is disposed in a lower portion of the second membrane layer 150b. Thus, the first membrane layer 150a is exposed to an upper surface (or a top surface) of the cavity C, while the second membrane layer 150b is not exposed to the cavity C due to the first membrane layer 150a.

The first membrane layer 150a may be formed of a material having a density higher than a density of the second membrane layer 150b. For example, the first membrane layer 150a may be formed of one among aluminum oxide-based, aluminum nitride-based, magnesium oxide-based, titanium oxide-based, zirconium oxide-based, and zinc oxide-based insulating materials.

In more detail, the first membrane layer 150a may be formed of one among aluminum oxide ($Al_2O_3$) aluminum nitride (AlN), magnesium oxide (MgO), titanium oxide ($TiO_2$), zirconium oxide ($ZrO_2$), and zinc oxide (ZnO).

The first membrane layer 150a may have a membranous layer, that has a density level that is higher than a density level of the second membrane layer 150b. Thus, the absorption of the hydroxyl group in a portion of an inner wall of the cavity C, corresponding to a lower surface of the resonant portion 120, may occur only in a surface of the first membrane layer 150a.

As described above, the first membrane layer 150a may function similarly to the second protective layer 127b described above.

The first membrane layer 150a and the second membrane layer 150b are sequentially stacked in an operation of stacking membrane layers 150, illustrated in FIG. 5, so an acoustic resonator according to an embodiment, configured as described above, may be manufactured.

In an embodiment, the hydrophobic layer 130 may be directly deposited on a surface of an inner wall of the cavity C, formed by the first membrane layer 150a and the insulating layer 115.

The configuration described above may be manufactured through an operation of forming a second protective layer 127b while an inlet hole (H of FIG. 1) is blocked, after a trimming process illustrated in FIG. 8, and an operation of forming a hydrophobic layer 130 after the inlet hole (H of FIG. 1) is open again.

However, a method for manufacturing an acoustic resonator according to an example is not limited thereto. For example, an acoustic resonator according to an example may be manufactured through an operation of forming a first protective layer 127a and a second protective layer 127b, an operation of forming a cavity C by removing a sacrificial layer 140, an operation of performing a trimming process while partially removing the second protective layer 127b, and an operation of forming a hydrophobic layer 130.

Moreover, in an example, the example in which a second protective layer 127b is not provided in the cavity C is described by way of example. However, as illustrated in FIG. 2, a second protective layer 127b may be provided as needed.

As set forth above, according to an embodiment in the present disclosure, a first protective layer and a second protective layer, formed of different materials, are stacked to form a protective layer, and a hydrophobic layer may be disposed on the second protective layer. Thus, even when an acoustic resonator is used in a humid environment or left at room temperature for a long period of time, a frequency variation may be significantly reduced and a resonator performance may be uniformly maintained.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator, comprising:
   a substrate;
   a resonant portion disposed on the substrate, and on which a first electrode, a piezoelectric layer, and a second electrode are stacked;
   a protective layer disposed on an upper portion of the resonant portion; and
   a hydrophobic layer formed on the protective layer,
   wherein the protective layer comprises a first protective layer stacked on the second electrode, and a second protective layer stacked on the first protective layer, and
   wherein a density of the second protective layer is higher than a density of the first protective layer.

2. The acoustic resonator of claim 1, wherein a cavity is formed in a lower portion of the resonant portion, and
   the hydrophobic layer is further formed on an inner wall of the cavity.

3. The acoustic resonator of claim 2, wherein the second protective layer is further disposed between the inner wall of the cavity and the hydrophobic layer.

4. The acoustic resonator of claim 1, wherein the first protective layer is formed of one of a silicon oxide-based insulating material and silicon nitride-based insulating material.

5. The acoustic resonator of claim 1, wherein the second protective layer is formed of one of an aluminum oxide-based insulating material, an aluminum nitride-based insulating material, a magnesium oxide-based insulating material, a titanium oxide-based insulating material, a zirconium oxide-based insulating material, and a zinc oxide series insulating material.

6. The acoustic resonator of claim 1, wherein the first protective layer is formed of one of silicon dioxide ($SiO_2$), silicon nitride ($Si_3N_4$), amorphous silicon (a-Si), and polycrystalline silicon (p-Si).

7. The acoustic resonator of claim 1, wherein the second protective layer is formed of one of aluminum oxide ($Al_2O_3$) aluminum nitride (AlN), magnesium oxide (MgO), titanium oxide ($TiO_2$), zirconium oxide ($ZrO_2$), zinc oxide (ZnO).

8. The acoustic resonator of claim 1, wherein the second protective layer is formed to have a thickness that is less than a thickness of the first protective layer.

9. The acoustic resonator of claim 1, wherein the hydrophobic layer is formed of a self-assembled monolayer (SAM) forming material.

10. The acoustic resonator of claim 9, wherein the hydrophobic layer has a thickness of 100 Å or less.

11. The acoustic resonator of claim 1, wherein the hydrophobic layer contains a fluorine (F) component.

12. The acoustic resonator of claim 11, wherein the hydrophobic layer contains fluorocarbon that has a silicon head.

13. The acoustic resonator of claim 1, wherein the resonant portion comprises: a center portion; an extension portion that extends outwardly from the center portion; and an insertion layer that is disposed in a lower portion of the piezoelectric layer, and
   the piezoelectric layer comprises a piezoelectric portion disposed in the center portion, and a bent portion disposed in the extension portion, and configured to extend from the piezoelectric portion to be inclined along a shape of the insertion layer.

14. The acoustic resonator of claim 1, further comprising:
   a membrane layer disposed on the substrate, and configured to support the resonant portion; and
   a cavity disposed between the membrane layer and the substrate,
   wherein the membrane layer comprises a first membrane layer and a second membrane layer disposed between the first membrane layer and the first electrode, and
   the first membrane layer is formed of a material having a density that is higher than a density of the second membrane layer.

15. The acoustic resonator of claim 14, wherein the second membrane layer is formed of one of a silicon oxide-based insulating material and a silicon nitride-based insulating material.

16. The acoustic resonator of claim 14, wherein the second membrane layer is formed of one of an aluminum oxide-based insulating material, an aluminum nitride-based insulating material, a magnesium oxide-based insulating material, a titanium oxide-based insulating material, a zirconium oxide-based insulating material, and a zinc oxide-based insulating material.

17. An acoustic resonator, comprising:
   a substrate;
   a resonant portion disposed on the substrate, and on which a first electrode, a piezoelectric layer, and a second electrode are stacked;
   a protective layer disposed on an upper portion of the resonant portion;
   a cavity disposed between the first electrode and the substrate;
   a first hydrophobic layer formed on the protective layer; and a second hydrophobic layer formed on at least one inner wall of the cavity.

18. The acoustic resonator of claim 17, wherein the first hydrophobic layer and the second hydrophobic layer are formed of a self-assembled monolayer (SAM) forming material.

* * * * *